(12) United States Patent
Ikumo et al.

(10) Patent No.: US 7,355,124 B2
(45) Date of Patent: Apr. 8, 2008

(54) MULTILAYER WIRING BOARD AND ITS MANUFACTURING METHOD

(75) Inventors: Masamitsu Ikumo, Kawasaki (JP); Tadahiro Okamoto, Kawasaki (JP); Eiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 35 days.

(21) Appl. No.: 11/180,780

(22) Filed: Jul. 14, 2005

(65) Prior Publication Data

US 2006/0219429 A1    Oct. 5, 2006

(30) Foreign Application Priority Data

Mar. 31, 2005    (JP) .............................. 2005-105232

(51) Int. Cl.
*H05K 1/03* (2006.01)

(52) U.S. Cl. ...................... 174/255; 174/254

(58) Field of Classification Search ................ 174/255, 174/250; 361/792, 793, 794, 795

See application file for complete search history.

(56) References Cited

U.S. PATENT DOCUMENTS

| | | | | |
|---|---|---|---|---|
| 5,047,279 A | * | 9/1991 | Nasu et al. | 428/156 |
| 5,773,764 A | * | 6/1998 | von Vajna | 174/250 |
| 6,239,381 B1 | * | 5/2001 | Kasai et al. | 174/252 |

FOREIGN PATENT DOCUMENTS

| | | |
|---|---|---|
| JP | 10-27971 | 1/1998 |
| JP | 10-135157 | 5/1998 |

* cited by examiner

*Primary Examiner*—Ishwar (I. B.) Patel
(74) *Attorney, Agent, or Firm*—Westerman, Hattori, Daniels & Adrian, LLP.

(57) ABSTRACT

A multilayer wiring board having a plurality of wiring boards in which wiring layers and resin layers in each wiring board are alternately arranged in a laminated formation. In the multilayer wiring board, all the resin layers and the wiring layers, except a resin layer in the plurality of wiring boards, are separated in a same position between the plurality of wiring boards and the resin layer is continuous in the same position.

1 Claim, 23 Drawing Sheets

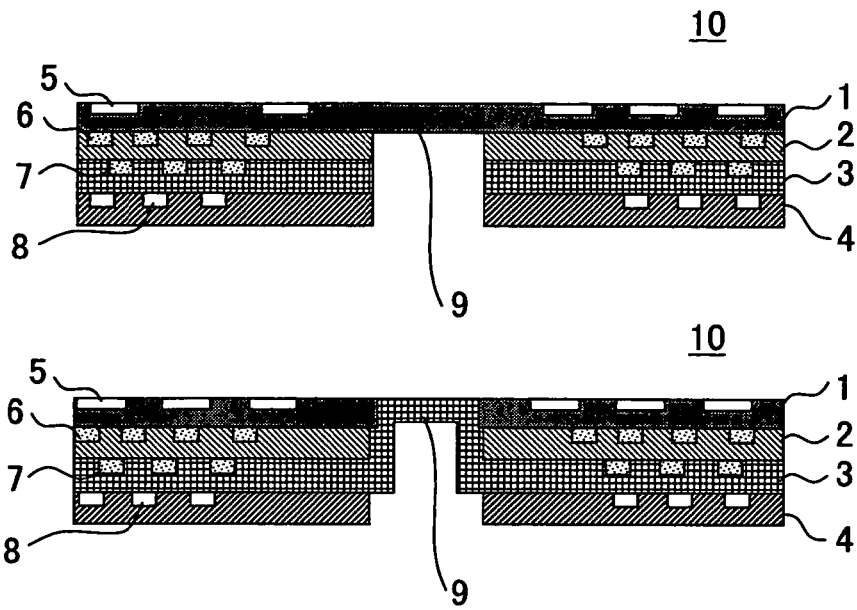
FIG.1A
FIG.1B
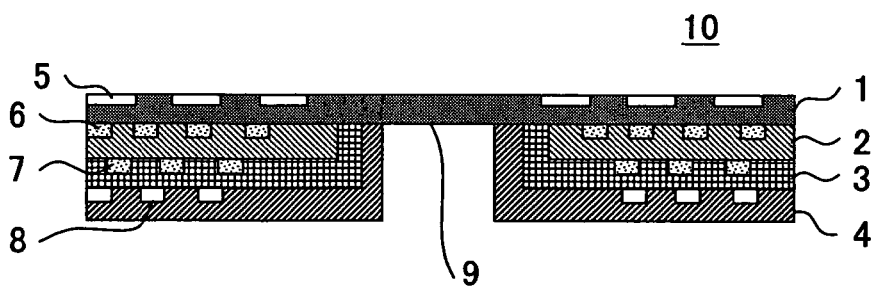
FIG.2A
FIG.2B

MULTILAYER WIRING BOARD AND ITS MANUFACTURING METHOD

CROSS-REFERENCE TO RELATED APPLICATIONS

This application is based upon and claims the benefit of priority of Japanese Patent Application No.2005-105232, filed on Mar. 31, 2005, the entire contents of which are hereby incorporated by reference.

BACKGROUND OF THE INVENTION

1. Field of the Invention

The present invention generally relates to a multilayer wiring board and its manufacturing method, and more particularly to a coreless interposer board and its manufacturing method in which a plurality of resin layers and a plurality of wiring layers are alternately arranged in laminated formation.

2. Description of the Related Art

In recent years, development of SIP (System In Package) of various types is carried out in order to meet the demands for high-speed, high-density LSI packages. SIP is a kind of the technology for incorporating two or more semiconductor chips to a single semiconductor package. Development of an interposer board on which two or more semiconductor chips are carried is also briskly performed with the development of SIP.

For example, the interposer board is a wiring board in which wiring layers made of metal, such as copper, and insulating layers made of resin, such as an epoxy or polyimide resin, are laminated alternately.

Usually, a plurality of interposer boards are formed in a comparatively large base board collectively, and thereafter a dicing process is performed to cut the base board into the respective interposer boards.

Japanese Laid-Open Patent Application No. 10-027971 discloses the cutting process of an organic thin-film multilayer wiring board in order for preventing the removal of the organic thin film from the substrate after cutting and the cleavage of the substrate after cutting.

Japanese Laid-Open Patent Application No. 10-135157 discloses the multilayer wiring board and its manufacturing method in order for preventing the removal of the interlayer insulation film in a dicing process.

In the conventional methods mentioned above, it is necessary to cut mechanically the resin layers for which the laminated formation is carried out with a dicing blade etc. By the external force applied in the dicing process, the resin layers for which the laminated formation is carried out may be damaged, or the film removal may occur in the interface of the respective resin layers.

FIG. 28 shows the composition of a conventional multilayer wiring board. The multilayer wiring board 20 of FIG. 28 is a multilayer wiring board on which a plurality of wiring boards (in this example, two pieces) are arranged sidewise, and the first through fourth resin layers 1-4 and the first through fourth wiring layers 5-8 in each wiring board are laminated alternately and these layers do not have a core substrate.

When the multilayer wiring board 20 is cut into the respective wiring boards, the cutting area 9 indicated by the dotted line in FIG. 28 is mechanically cut with a dicing blade.

In the case of the multilayer wiring board 20 of FIG. 28, all the resin layers 1-4 are mechanically cut by the dicing blade. In the mechanical cutting, all the resin layers tend to be damaged, and the removal of each resin layer in the interface easily occurs.

Even if the removal of the resin layer in the resin interface at the time of cutting is avoided, there is the problem that reliability of the respective wiring boards deteriorates due to the resin damage at the time of cutting.

In order to avoid the problem, for example, Japanese Laid-Open Patent Application No. 10-027971 proposes the method of cutting mechanically the multilayer wiring board with a dicing blade after the resin layers are removed by a laser beam cutting.

However, in the proposed method of Japanese Laid-Open Patent Application No. 10-027971, the protection of the cross-section of the resin layers at the time of cutting mechanically is not taken into consideration. Moreover, the introduction of the laser machine for cutting the resin layers, the increase in the manufacturing processes needed, etc. are necessary, which will raise the cost. Thus, the proposed method is not feasible in the actual production line.

On the other hand, the proposed method of Japanese Laid-Open Patent Application No. 10-135157 is effective for the multi-layer wiring board having the core substrate on which the resin layers and the wiring layers are held.

However, in the case of the coreless wiring board in which all the layers are formed of resin and which does not have a core substrate, it cannot be said that the proposed method of Japanese Laid-Open Patent Application No. 10-135157 provides adequate effects of preventing the removal of the interlayer insulation film when cutting mechanically the wiring board.

SUMMARY OF THE INVENTION

An object of the present invention is to provide an improved multilayer wiring board in which the above-mentioned problems are eliminated.

Another object of the present invention is to provide a multilayer wiring board which is highly reliable and excellent in the electrical properties by reducing or avoiding the resin removal and damage at the time of mechanical cutting.

Another object of the present invention is to provide a manufacturing method of a multilayer wiring board which is highly reliable and excellent in the electrical properties by reducing or avoiding the resin removal and damage at the time of mechanical cutting.

In order to achieve the above-mentioned objects, the present invention provides a multilayer wiring board which comprises: a plurality of wiring boards in which wiring layers and resin layers in each wiring board are alternately arranged in a laminated formation, wherein all the resin layers and the wiring layers, except a resin layer in the plurality of wiring boards, are separated in a same position between the plurality of wiring boards and the resin layer is continuous in the same position.

In order to achieve the above-mentioned objects, the present invention provides a manufacturing method of a multilayer wiring board having a plurality of wiring boards in which wiring layers and resin layers in each wiring board are alternately arranged in a laminated formation, the manufacturing method comprising steps of: forming a first resin layer and a first wiring layer on a supporting board; forming a second resin layer and a second wiring layer on the first resin layer; forming two or more additional resin layers and two or more additional wiring layers on the second resin layer alternately so that all the resin layers and the wiring layers, except a resin layer in the plurality of wiring boards, are separated in a same position between the plurality of wiring boards; and removing the supporting board.

In the multilayer wiring board of the present invention, the cutting area where the multilayer wiring board is cut into the respective wiring boards is constituted by only one resin layer. The exposed resin layers among the plurality of resin layers are the top layer and the bottom layer only, and other resin layers are not exposed.

In order to absorb the damage to the resin layers at the time of mechanical cutting, the cutting area is provided as the structurally weak layer. The resin layer being cut is made thinner, and the cutting of the multilayer wiring board itself is made easy.

Moreover, in the multilayer wiring board of the present invention, the resin cutting plane is covered with a metal film in order to protect the resin cutting plane. The grounding of each wiring layer is connected with a metal film. The multilayer wiring board of the present invention is configured so that all the laminated resin layers are not cut, but all the resin layers, except the resin layer being cut, are evacuated from the cutting area beforehand.

By this composition, it is possible to avoid the removal of the resin layer by the external force at the time of mechanical cutting. By preventing the exposure of the end face of each of the plurality of laminated resin layers, it is possible to reduce the damage to the laminated resin surface at the time of mechanical cutting, and the reliability is improved.

Moreover, in order to reduce the damage to the main part of the interposer board, the cutting area is provided as the structurally weak layer. The resin layer being cut is made thinner, and the cutting of the multilayer wiring board itself is made easy. By lowering the force exerting on the resin layer itself, the damage to the interposer board can also be reduced.

Moreover, the damage to the cross-section (end face) of the laminated resin layers at the time of mechanical cutting is prevented by covering the laminated resin layers with a metal film. In addition, the mechanical strength in the removing direction can also be raised with the metal film interconnecting the edges of the top and bottom resin layers. It is possible to also raise the reliability. Further, the electrical properties can also be raised by connecting the ground terminals of the wiring layers mutually.

According to the multilayer wiring board and its manufacturing method of the present invention, the damage at the time of mechanical cutting can be reduced, and it is possible to provide the interposer board whose reliability and electrical properties are raised.

BRIEF DESCRIPTION OF THE DRAWINGS

Other objects, features and advantages of the present invention will be apparent from the following detailed description when read in conjunction with the accompanying drawings.

FIG. 1A and FIG. 1B are cross-sectional views showing the composition of a multilayer wiring board in one embodiment of the present invention.

FIG. 2A and FIG. 2B are cross-sectional views showing the composition of modifications of the multilayer wiring board of FIG. 1A.

DETAILED DESCRIPTION OF PREFERRED EMBODIMENTS

Figure 3:
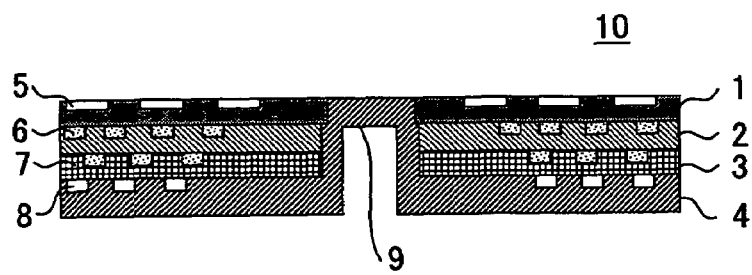
FIG. 3 is a cross-sectional view showing the composition of a modification of the multilayer wiring board of FIG. 1A.

A description will now be given of the preferred embodiments of the invention with reference to the accompanying drawings.

FIG. 1A and FIG. 1B show the composition of the multilayer wiring board in one embodiment of the invention.

For the sake of convenience, a different hatching is given to show each of the first through fourth resin layers 1-4 in the embodiment of FIG. 1A and FIG. 1B, but each layer is made of the same resin material.

In the multilayer wiring board 10 of FIG. 1A, the two wiring boards are arranged in which the laminated formation of each wiring board is performed so that the plurality of resin layers (namely, the first resin layer 1, the second resin layer 2, the third resin layer 3 and the fourth resin layer 4) and the plurality of wiring layers (namely, the first wiring layer 5, the second wiring layer 6, the third wiring layer 7 and the fourth wiring layer 8) are alternately arranged, and each layer does not have a core substrate. In order to cut the multilayer wiring board 10 into the respective wiring boards, the wiring boards in the multilayer wiring board 10 of this embodiment are continuously interconnected by the first resin layer 1 only.

Similarly, in the multilayer wiring board 10 of FIG. 1B, the two wiring boards are arranged in which the laminated formation of each wiring board is performs so that the first through fourth resin layers 1-4 and the first through fourth wiring layers 5-8 are alternately arranged, and each layer does not have a core substrate. In order to cut the multilayer wiring board 10 into the respective wiring boards, the wiring boards in the multilayer wiring board 10 of this embodiment are continuously interconnected by the third resin layer 3 only.

For example, in the multilayer wiring board 10 of FIG. 1A, only the first resin layer 1 is cut to produce the two wiring boards, and the other resin layers 2-4 among the plurality of resin layers 1-4 are formed so that they are evacuated from the cutting area 9, respectively.

Figure 28:
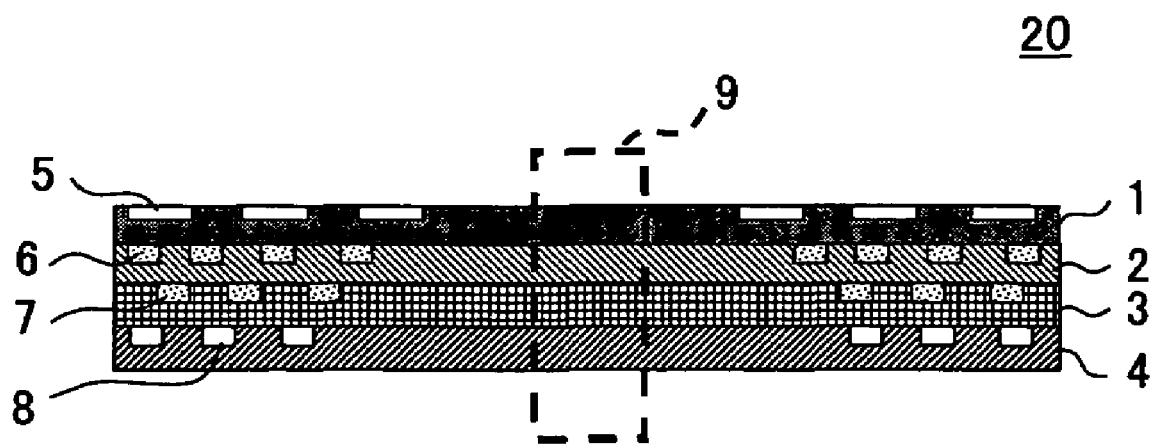
FIG. 28 is a cross-sectional view showing the composition of a conventional multilayer wiring board.

As mentioned above, in the conventional multilayer wiring board of FIG. 28, all the resin layers are cut to produce the two wiring boards, and all the resin layers may be damaged at the time of cutting.

In contrast, in the present embodiment, only one resin layer is cut and the two wiring boards are produced, and it is possible to reduce the damage of the plurality of resin layers at the time of cutting.

Moreover, in the multilayer wiring board 10 of FIG. 1B, the third resin layer 3 which is formed to be continuous with the intermediate resin layer among the resin layers 1-4 of each wiring board has a raised portion in the cutting area 9 between the two wiring boards, and this raised portion is flush with the outside resin layer 1. And only the third resin layer 3 is cut at the raised portion to produce the two wiring boards, and the other resin layers 1, 2 and 4 among the plurality of resin layers 1-4 are formed so that they are evacuated from the cutting area 9, respectively.

In this embodiment, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of copper (Cu), nickel (Ni) and gold (Au), solely or in combination.

In FIG. 1A and FIG. 1B, the cutting area 9 is provided to show the portion where the multilayer wiring board 10 is cut into the respective wiring boards. For example, when the width of a dicing blade used for cutting is about 150 micrometers, the width of the cutting area 9 is about 200 micrometers.

Figure 26:
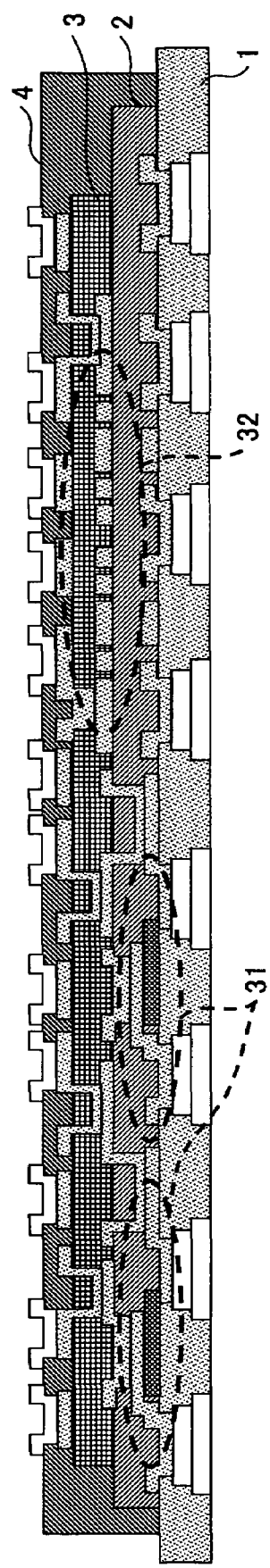
FIG. 26 is a cross-sectional view showing the composition of an interposer board to which the multilayer wiring board of the present invention is applied.

FIG. 26 shows the composition of an interposer board to which the multilayer wiring board of the present invention is applied.

In the interposer board 30 shown in FIG. 26, the capacitor 31 and the inductor 32 are formed inside the wiring boards which are produced by cutting the multilayer wiring board 10.

In each of the wiring boards, the laminated formation of the first through fourth resin layers 1-4 is performed, and each wiring board is provided with the cross-section where only the first resin layer 1 is cut at the dicing process. Therefore, the damage at the time of cutting of the multilayer wiring board 10 can be reduced, and it is possible to provide the structure of an interposer board with the reliability and electrical properties being raised.

Figure 27:
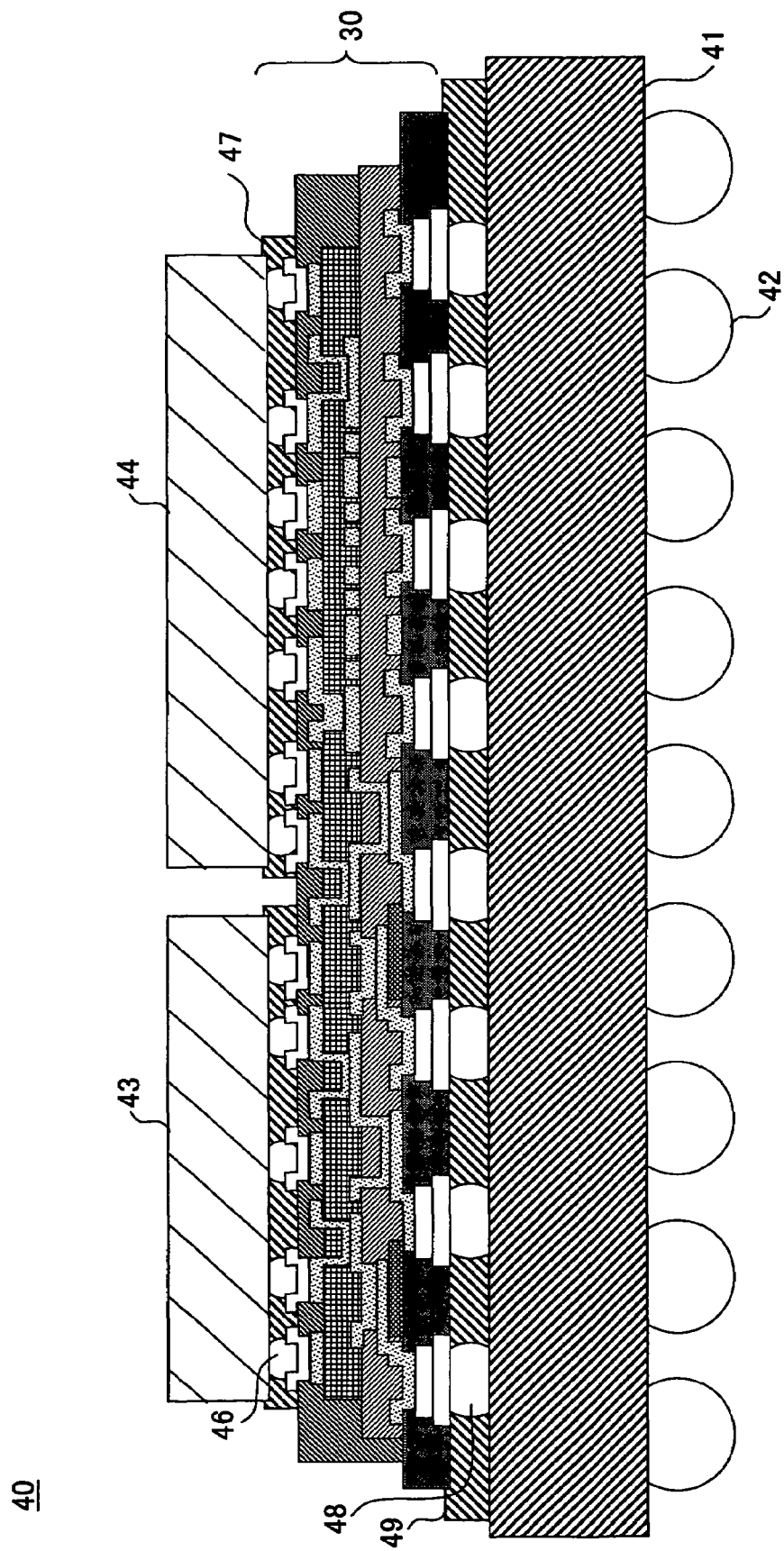
FIG. 27 is a cross-sectional view showing the composition of a semiconductor device in which the interposer board to which the multilayer wiring board of the invention is applied is mounted on the mounting board.

FIG. 27 shows the composition of a semiconductor device in which the interposer board to which the multilayer wiring board of the invention is applied is mounted on the mounting board.

In the semiconductor device 40 shown in FIG. 27, the composition of a multi-chip module is provided in which the semiconductor chip 43 (the first chip) and the semiconductor chip 44 (the second chip) are mounted on the mounting board 41 through the interposer board 30. In this case, the interposer board 30 has the same composition as the interposer board 30 of FIG. 26.

In this semiconductor device 40, each of the semiconductor chips 43 and 44 is fixed to the interposer board 30 via the under-fill 47. The semiconductor chip 43 and the semiconductor chip 44 are connected to the electrode pads on the interposer board 30 through the solder bumps 46 which are formed on the bottom surface of each of the semiconductor chips 43 and 44.

The interposer board 30 is fixed to the mounting board 41 via the under-fill 49. The solder bumps 42 are formed on the bottom surface of the mounting board 41, and this semiconductor device 40 is further mounted on the mother board (not illustrated).

Next, FIG. 2A and FIG. 2B show the composition of modifications of the multilayer wiring board of FIG. 1A.

In the embodiment of FIG. 2A and FIG. 2B, only the top resin layer 1 and the bottom resin layer 4 are exposed to the outside of the multilayer wiring board, so that the end face of the other resin layers 2 and 3 is protected. By this composition, it is possible to prevent the damage at the time of the cutting process from reaching the resin end face, and the reliability can be improved.

Moreover, in the multilayer wiring board 10 of FIG. 2B, the fourth resin layer 4 which is formed to be continuous with the outside resin layer 1 among the resin layers 1-4 of each wiring board has a raised portion in the cutting area 9 between the two wiring boards, and this raised portion is covers an end face of the other resin layers 2 and 3 among the plurality of resin layers 1-4. And only the first resin layer 1 is cut at the raised portion to produce the two wiring boards, and the other resin layers 2 and 3 among the plurality of resin layers 1-4 are formed so that they are evacuated from the cutting area 9, respectively.

In the embodiment of FIG. 2A and FIG. 2B, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

In the embodiment of FIG. 2A and FIG. 2B, the distance from the outside surface near the cutting area 9 of the resin layer 4 to the end face of the resin layers 2 and 3 is about 10-30 micrometers. However, when the adhesion force of the resin layers to be used is extremely weak, in order to achieve a certain level of strength, the distance of this portion may be set to about 100 micrometers.

FIG. 3 shows the composition of a modification of the multilayer wiring board of FIG. 1A.

In the embodiment of FIG. 3, the fourth resin layer 4 is used in the cutting area 9 which will be cut at a next step, the end face of the other resin layers 1-3 is covered with the raised portion of the fourth resin layer 4, and it is possible to reduce the damage at the time of cutting more effectively. In connection with this, the reliability of the multilayer wiring board is also improved. The end face of the resin layers 1-3 for which the laminated formation is performed is covered with the raised portion of the fourth resin layer 4, and it is possible to realize a compact interposer board without the damage and without lowering the reliability.

Moreover, in the multilayer wiring board 10 of FIG. 3, the fourth resin layer 4 which is formed to be continuous with the outside resin layer 1 among the resin layers 1-4 of one of the two wiring boards has a raised portion in the cutting area 9 between the two wiring boards, and this raised portion is flush with the outside resin layer 1 among the resin layers 1-4 of the other of the two wiring boards.

In the embodiment of FIG. 3, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 4A:
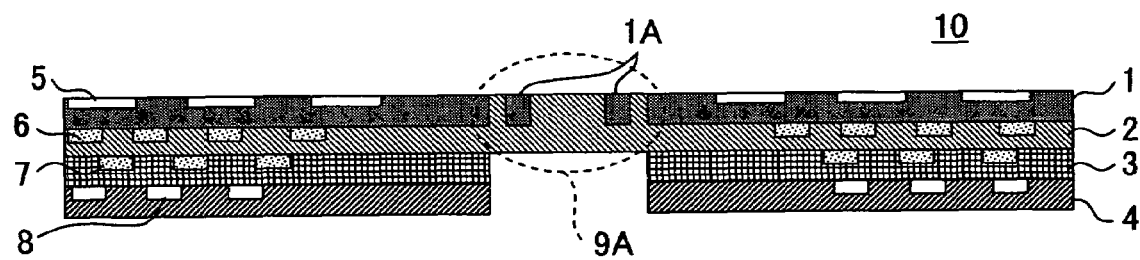
FIG. 4A and FIG. 4B are cross-sectional views showing the composition of a multilayer wiring board in another embodiment of the present invention.
Figure 4B:
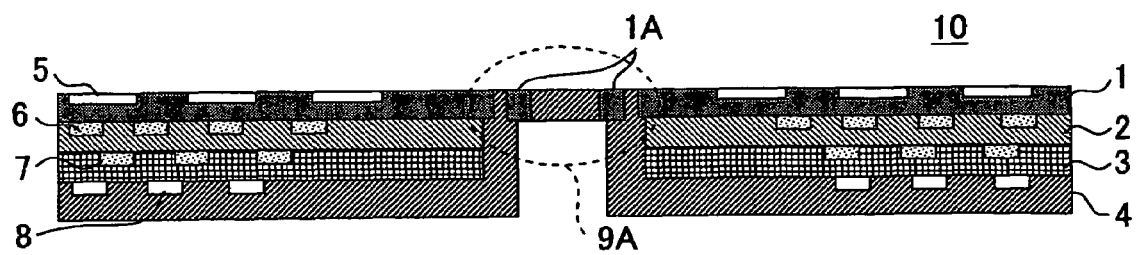

FIG. 4A and FIG. 4B show the composition of a multilayer wiring board in another embodiment of the present invention.

In the embodiment of FIG. 4A and FIG. 4B, the isolated areas 1A which are weaker than the structure of the interposer board in strength are formed in the region near the upper surface of the resin layer 2 (or 4) which will be cut as the crumple zone. By this composition, the damage at the time of cutting can be absorbed with the isolated areas 1A, and the damage to the interposer board can be reduced.

In the embodiment of FIG. 4A, the isolated areas 1A are formed in the second resin layer 2 by using the resin material of the first resin layer 1. When cutting the second resin layer 2, the portion of the isolated areas 1A serves as the crumple zone 9A, and it is possible to reduce the damage to the portion outside the isolated areas 1A.

In the embodiment of FIG. 4B, the isolated areas 1A are formed in the fourth resin layer 4 by using the resin material of the first resin layer 1. When cutting the fourth resin layer 4, the portion of the isolated areas 1A serves as the crumple zone 9A, and it is possible to reduce the damage to the portion outside the isolated areas 1A.

The size and distance of the isolated areas 1A are usually about 10-30 micrometers, respectively. It is better to set up the size and distance for every resin layer since the optimum value for every resin varies according to the kind of the resin.

Also in this embodiment, the thickness of each of the resin layers is about 4-6 micrometers, and the thickness of each of the wiring layers is about 3-8 micrometers. The resin layers are made of any of a polyimide resin, a phenol resin, an epoxy resin, a silicon-based resin and BCB, and the wiring layers are made of any of Cu, Ni and Au, solely or in combination.

FIG. 5A through FIG. 5E show the composition of modifications of the multilayer wiring board of FIG. 4A.

In the embodiments of FIG. 5A through FIG. 5E, the size of the isolated areas 1A is the same as that of the embodiment of FIG. 4A.

However, unlike the embodiment of FIG. 4A, the isolated areas 1A are not covered with the continuous resin layer. For this reason, the external force at the time of mechanical cutting can be distributed more effectively.

Figure 5A:
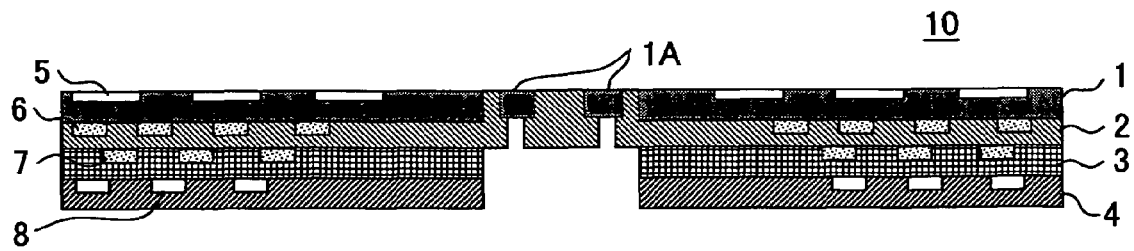
FIG. 5A, FIG. 5B, FIG. 5C, FIG. 5D and FIG. 5E are cross-sectional views showing the composition of modifications of the multilayer wiring board of FIG. 4A.
Figure 5B:
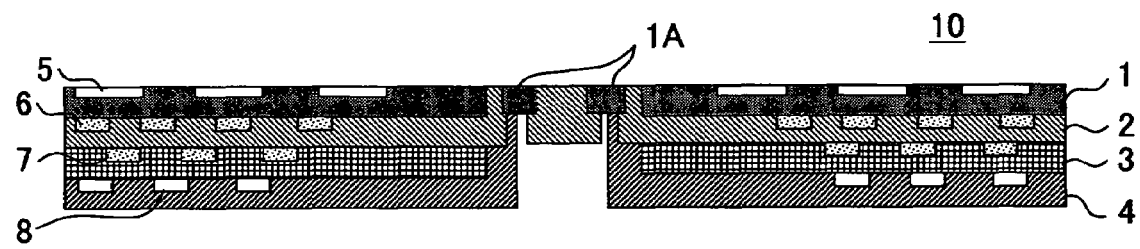
Figure 5C:
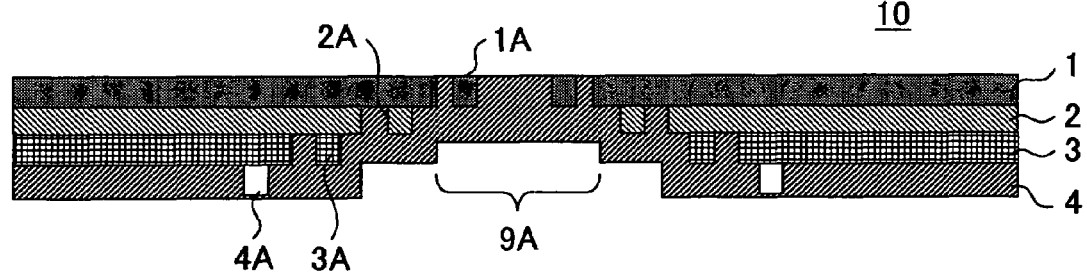
Figure 5D:
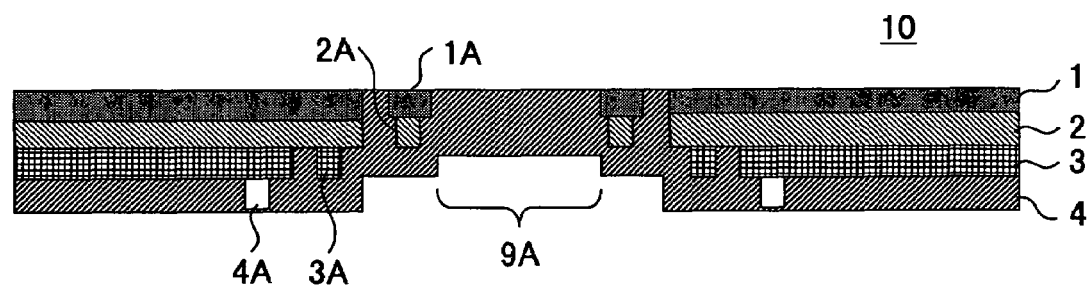
Figure 5E:
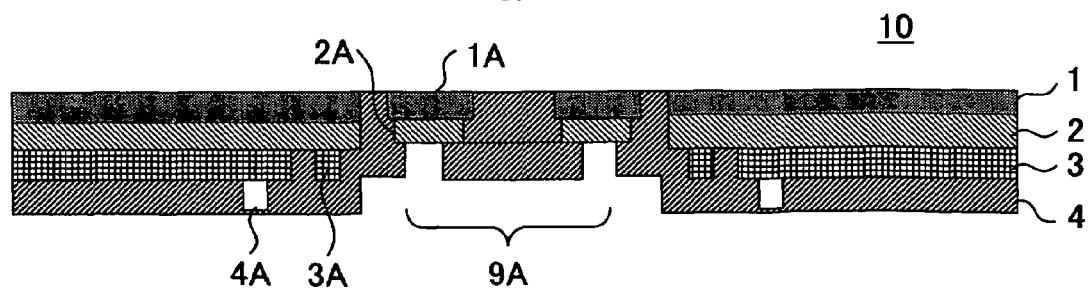

It is also effective to form the isolated areas for every resin layer, and to form the crumple zone 9A, as shown in FIG. 5C, FIG. 5D and FIG. 5E.

Also in the embodiment of FIG. 5A to FIG. 5E, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni, and Au, solely or in combination.

Figure 6A:
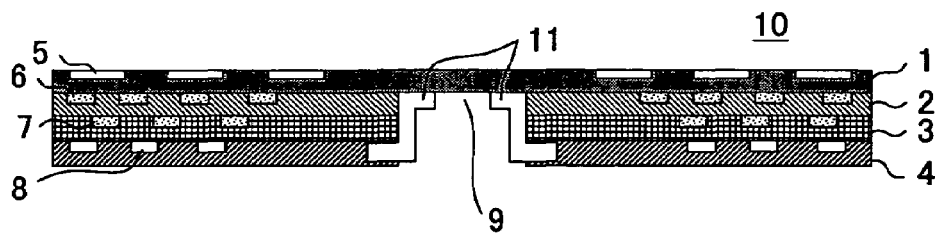
FIG. 6A and FIG. 6B are cross-sectional views showing the composition of a multilayer wiring board in another embodiment of the present invention.
Figure 6B:
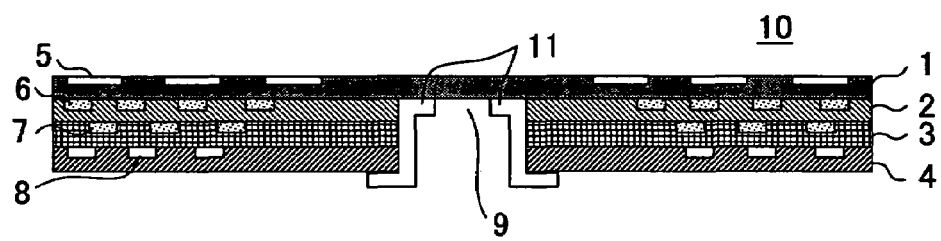
Figure 7A:
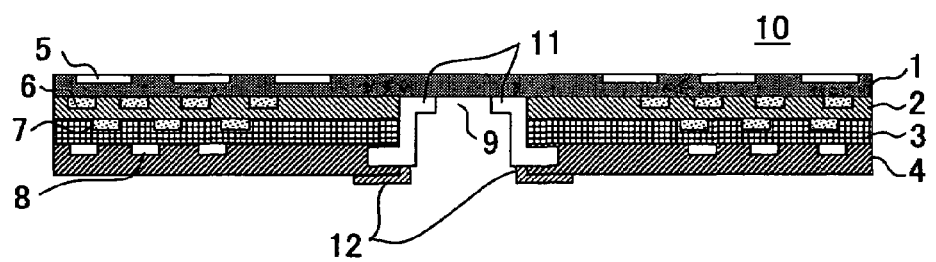
FIG. 7A and FIG. 7B are cross-sectional views showing the composition of modifications of the multilayer wiring board of FIG. 6A.
Figure 7B:
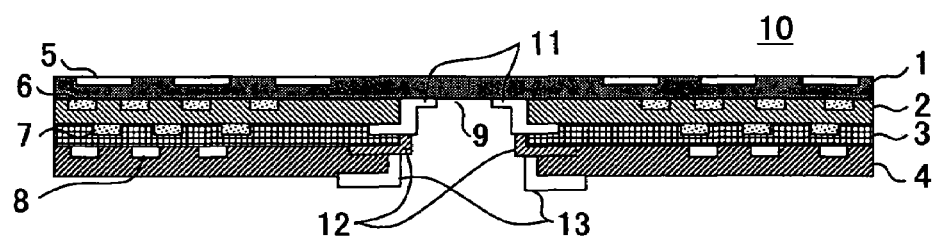

FIG. 6A and FIG. 6B show the composition of the multilayer wiring board in another embodiment of the present invention. FIG. 7A and FIG. 7B show the composition of modifications of the multilayer wiring board of FIG. 6A.

In the present embodiment, the end face of the other resin layers 2-4 other than the resin layer 1 which will be cut at a next step is covered with the metal film 11, and it is possible to raise the reliability of the multilayer wiring board more.

It is possible to strengthen the cross section more firmly according to the anchor effect by forming the metal films 11, 12, and 13 to cover the end face of each of the resin layers 2, 3 and 4, respectively.

Also in the embodiment of FIG. 6A to FIG. 7B, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 8A:
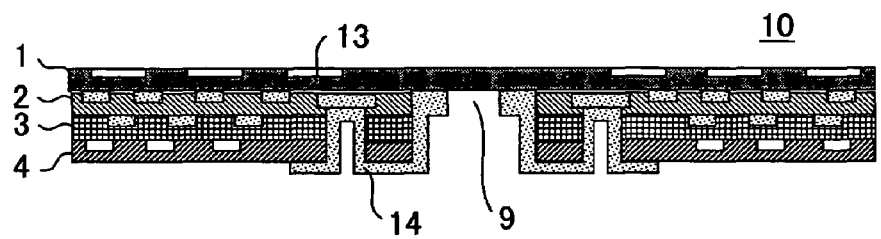
FIG. 8A and FIG. 8B are diagrams showing the composition of a modification of the multilayer wiring board of FIG. 6A.
Figure 8B:
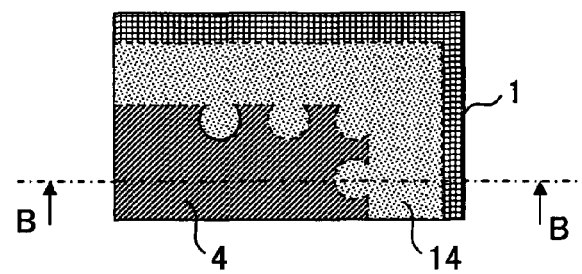

FIG. 8A and FIG. 8B show the composition of a modification of the multilayer wiring board of FIG. 6A. FIG. 8A is a cross-sectional view of the multilayer wiring board of the present embodiment, and FIG. 8B is a top view of the portion of the multilayer wiring board indicated by the dotted line A in FIG. 8A.

In the present embodiment, the end face of the resin layers 2-4 other than the resin layer 1 is covered with the metal film 14, and this metal film 14 is connected with the metal film 13 formed on the resin layer 1. Thus, the end face of the resin layers 2-4 is protected more firmly, and the adhesion force of the metal film 13 is also raised.

By this composition, the peripheral part of the resin layers 2-4 will be reinforced with the metal film 13, and the reliability is improved more.

Also in the embodiment of FIG. 8A, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon resin and BCB, and the wiring layers 5-8 are made of any of Cu, Ni and Au, solely or in combination.

Figure 9:
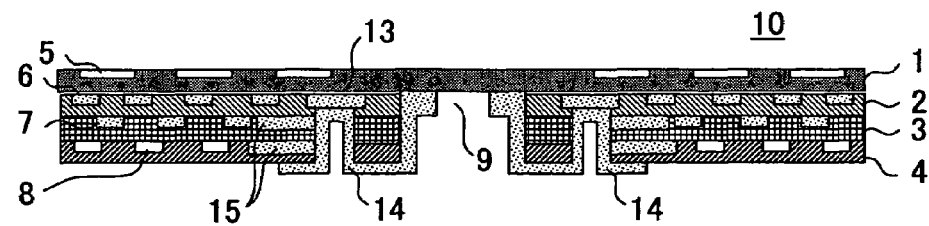
FIG. 9 is a cross-sectional view showing the composition of a modification of the multilayer wiring board of FIG. 8A.

FIG. 9 shows the composition of a modification of the multilayer wiring board of FIG. 8A.

In the embodiment of FIG. 9, the metal film 13 is formed for covering the peripheral part of the resin layers 2-4, and this metal film 13 is connected to the ground wiring 15 of each resin layer The electrical properties can be improved by the composition of the multilayer wiring board of FIG. 9.

Also in the composition of the embodiment of FIG. 9, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 10A:
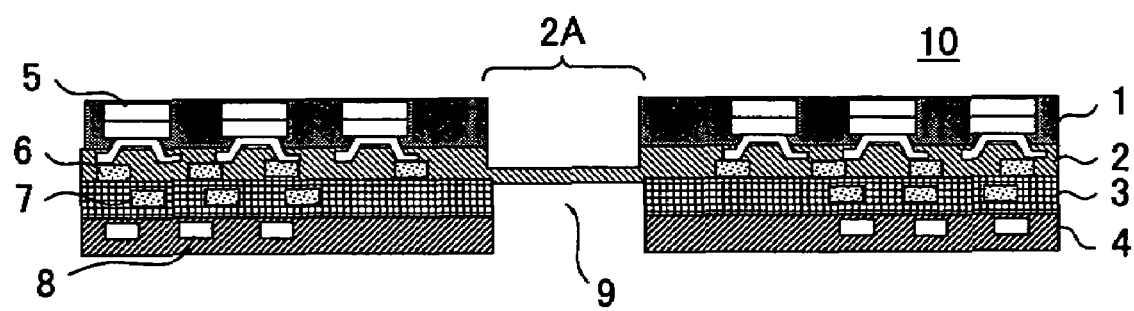
FIG. 10A and FIG. 10B are cross-sectional views showing the composition of a multilayer wiring board in another embodiment of the present invention.
Figure 10B:
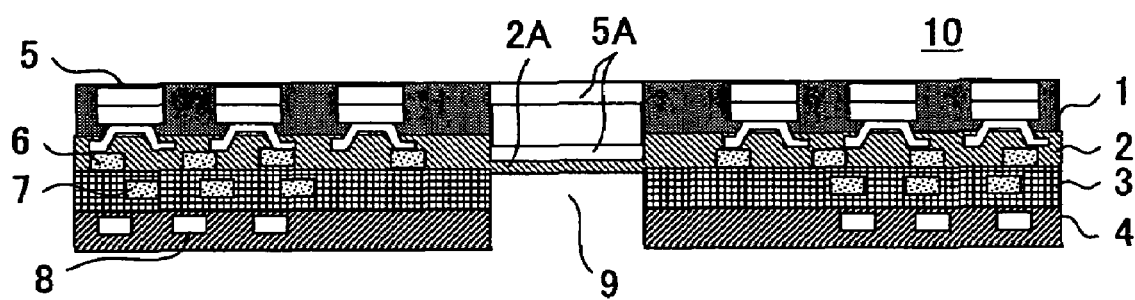

FIG. 10A and FIG. 10B show the composition of the multilayer wiring board in another embodiment of the present invention.

In the embodiment of FIG. 10A, the second resin layer 2 which will be cut at a next process is thinly formed (the concave portion 2A). It is possible to cut the thinly formed second resin layer 2 by a smaller cutting force, and the damage to the interposer board can be reduced further.

The depth of the concave portion 2A formed in the cutting area 9 in the second resin layer 2 is about 1-4 micrometers, and the thickness of the second resin layer 2 of this portion is above 1-3 micrometers.

In the embodiment of FIG. 10B, the second resin layer 2 which will be cut at a next process is thinly formed (the concave portion 2A), and the metal part of the cutting area 9 in the first wiring layer 5 is removed by the etching process (the metal removing part 5A). It is possible to cut the thinly formed second resin layer 2 by a smaller cutting force, and the damage to the interposer board can be reduced further.

The depth of the concave portion 2A formed in the cutting area 9 in the second resin layer 2 is about 1-4 micrometers, and the thickness of the second resin layer 2 of this portion is about 1-3 micrometers.

Also in the embodiment of FIG. 10A and FIG. 10B, the thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

FIG. 11A through FIG. 11E are diagrams for explaining the manufacturing method of the multilayer wiring board concerning the embodiment of FIG. 1A.

Figure 11A:
FIG. 11A, FIG. 11B, FIG. 11C, FIG. 11D and FIG. 11E are diagrams for explaining the manufacturing method of the multilayer wiring board concerning the embodiment of FIG. 1A.

In the present embodiment, as shown in FIG. 11A, after the first wiring layer 5 is formed on the supporting board 17, the first resin layer 1 is formed. The via (not illustrated) for connecting electrically the first wiring layer 5 and the second wiring layer 6 is formed in the first resin layer 1.

Figure 11B:
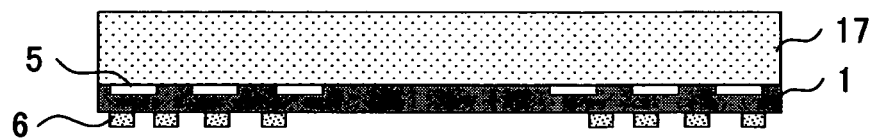
Figure 11C:
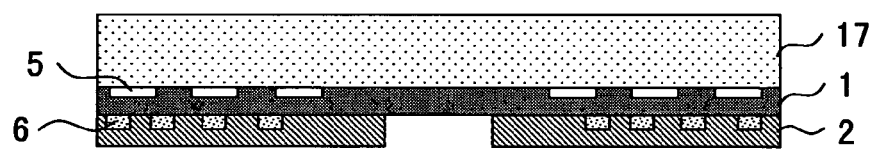

As shown in FIG. 11B, the second wiring layer 6 is formed on the first resin layer 1. And as shown in FIG. 11C, the second resin layer 2 is formed on the first resin layer 1 and the second wiring layer 6.

At this time, the second resin layer 2 is formed so that it is evacuates from the cutting area 9 which will be cut at a next process.

Figure 11D:
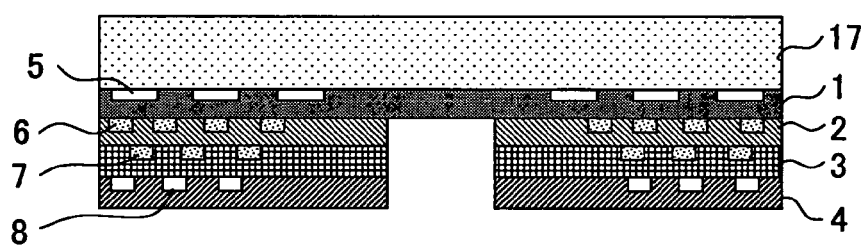

As shown in FIG. 11D, the third and fourth wiring layers 7 and 8 and the third and fourth resin layers 3 and 4 are formed similarly.

As shown in FIG. 11A, the first resin layer 1 and the first wiring layer 5 are formed on the supporting board 17 which is made of silicon (Si). In this case, a silicon wafer is used. In this embodiment, the resin layers 1-4 are formed using the polyimide resin I-8150G from Asahi Chemical Co.

Each resin layer is formed into a thin film which is about 5-6 micrometers thick after resin curing. Since the above-mentioned polyimide resin is photosensitive polyimide resin, when forming the second through fourth resin layers 2-4 and making them being evacuated from the cutting area 9, they can be formed by performing the photo-lithography process.

Specifically, after the above-mentioned polyimide resin is applied, it is exposed to the light exposure of about 500 mJ using the g-line steppers, such as TITAN from ULTRATEC Co. Then, the development and rinsing are performed using the developing solution A-430 and the rinsing solution C-260 from KURARIANTO JAPAN Co. At this time, the via for electrically connecting the respective wiring layers is also formed simultaneously.

After each resin layer is formed, a wiring layer is formed on the resin layer. For example, the case where each wiring layer is formed using the electrolytic plating method will be explained.

On the resin layer, an electric supply layer is formed by the sputtering process. In the case of this embodiment, titanium (Ti) and Cu are formed by a thickness of 100 nm and 250 nm, respectively.

After the sputtering process, the patterning is performed with the photoresist. For example, the posi-resist LA900 from TOKYO OHKA KOGYO Co is used as the photoresist, and the exposure of about 1000 mJ is performed by using the g-line stepper.

Similarly, the development is performed using the developing solution P-7 from TOKYO OHKA KOGYO Co., and the pattern is formed. After the pattern is formed, the electrolytic plating is performed to form the wiring layer.

The first through fourth wiring layers 1-4 are made of any of Cu, Ni and Au, solely or in combination. In this embodiment, the first wiring layer 1 is made of Ni/Au, the second and third wiring layers 2 and 3 are made of Cu, and the fourth wiring layer 4 is made of Cu/Ni/Au, respectively.

Next, the formation method of the second and third wiring layers 2 and 3 will be explained.

For example, the plated Cu layer is formed in a thickness of about 3 micrometers using CU300 from EEJA Co. The etching process to remove the electric supply layer is performed after the plating formation. An acetic peroxide and a hydrofluoric acid are used for the etching process of Cu and Ti, respectively. As for other wiring layers, the plating material is changed suitably and the wiring layers are formed similarly.

Figure 11E:
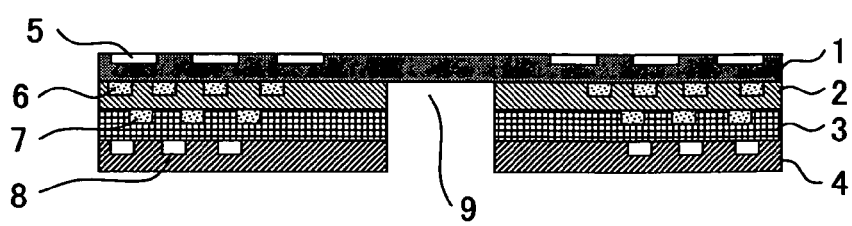

As shown in FIG. 11E, after all the resin layers 1-4 and the wiring layers 5-8 are formed, the supporting board 17 is removed. In this case, the removal of the Si substrate can be easily performed in such a manner that, after the supporting board 17 is thinned to a thickness of about 50 micrometers using a grinding machine, the thinned board is dissolved with a mixed acid of a hydrofluoric acid and a nitric acid.

By using the above-mentioned manufacturing method of FIG. 11A to FIG. 11E, it is possible to form easily the multilayer wiring board 10 in which the resin layers 2-4 are evacuated from the cutting area 9, without performing a special process.

FIG. 12A through FIG. 12E are diagrams for explaining the manufacturing method of the multilayer wiring board in the embodiment of FIG. 2A.

Figure 12A:
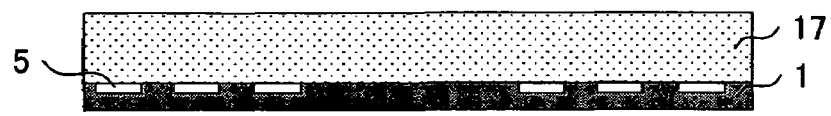
FIG. 12A, FIG. 12B, FIG. 12C, FIG. 12D and FIG. 12E are diagrams for explaining the manufacturing method of the multilayer wiring board concerning the embodiment of FIG. 2A.

In this embodiment, as shown in FIG. 12A, after forming the first wiring layer 5 on the supporting board 17, the first resin layer 1 is formed. The via (not illustrated) for connecting electrically the first wiring layer 5 and the second wiring layer 6 is formed in the first resin layer 1.

Figure 12B:
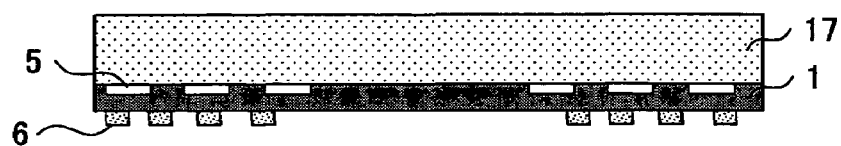

As shown in FIG. 12B, the second wiring layer 6 is formed on the first resin layer 1.

Figure 12C:
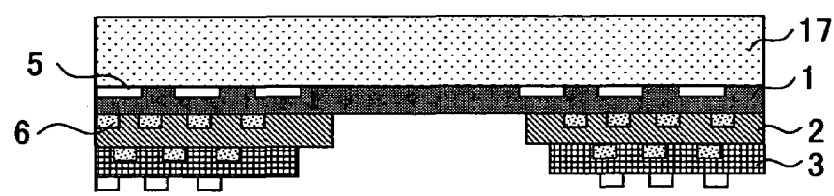

And as shown in FIG. 12C, the second resin layer 2 is formed on the first resin layer 1 and the second wiring layer 6.

At this time, the second resin layer 2 is formed so that it is evacuated from the cutting area 9 which will be cut at a next process.

As shown in FIG. 12C, the third wiring layer 7, the third resin layer 3, and the fourth wiring layer 8 are formed similarly.

Figure 12D:
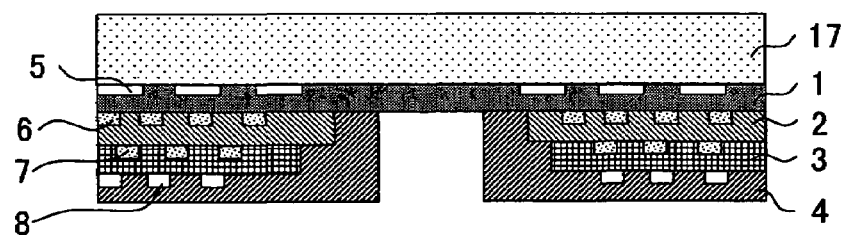

As shown in FIG. 12D, the fourth resin layer 4 is formed so that the second and third resin layers 2 and 3 are covered with the fourth resin layer 4. Only the first resin layer 1 and the fourth resin layer 4 are exposed to the outside of the multilayer wiring board 10.

Figure 12E:
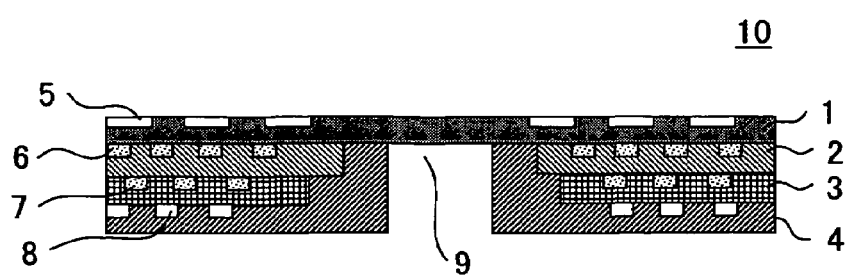

As shown in FIG. 12E, after the fourth resin layer 4 is formed, the supporting board 17 is removed.

The detailed composition of this embodiment is essentially the same as that of the above-described embodiment of FIG. 11E. According to the manufacturing method of this embodiment, it is possible to easily form the multilayer wiring board 10 in which only the top resin layer 1 and the bottom resin layer 4 among the plurality of resin layers are exposed to the outside.

FIG. 13A through FIG. 13E are diagrams for explaining the manufacturing method of the multilayer wiring board in the embodiment of FIG. 3.

Figure 13A:
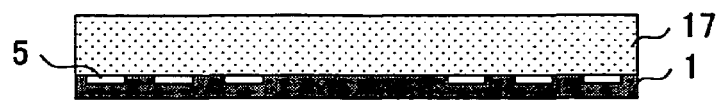
FIG. 13A, FIG. 13B, FIG. 13C, FIG. 13D and FIG. 13E are diagrams for explaining the manufacturing method of the multilayer wiring board concerning the embodiment of FIG. 3A.

In this embodiment, as shown in FIG. 13A, the first resin layer 1 is formed on the supporting board 17, so that it is evacuated from the cutting area 9 which will be cut at a next process.

Figure 13B:
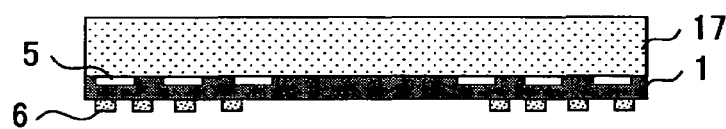
Figure 13C:
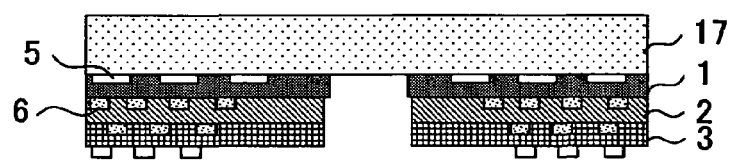

As shown in FIG. 13B and FIG. 13C, after the first wiring layer 5 is formed on the first resin layer 1, the laminated formation is similarly carried out for the second through fourth wiring layers 6 to 8.

Figure 13D:
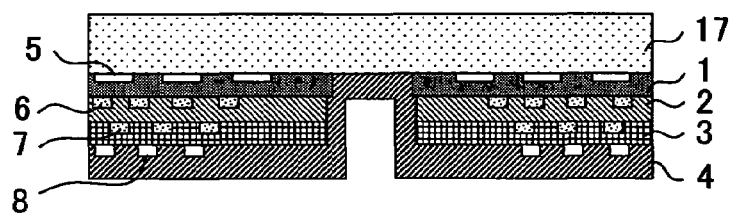

As shown in FIG. 13D, after the fourth wiring layer 8 is formed, the fourth resin layer 4 is formed so that the end face of the first through third resin layers 1-3 is covered with the fourth resin layer 4.

Figure 13E:
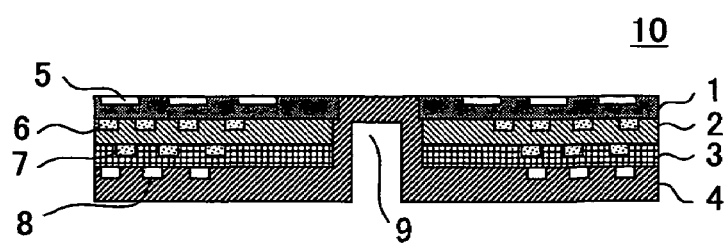

After the fourth resin layer 4 is formed, as shown in FIG. 13E, the supporting board 17 is removed.

The detailed composition of this embodiment is essentially the same as that of the above-described embodiment of FIG. 11E. According to the manufacturing method of this embodiment, it is possible to form easily the multilayer wiring board 10 in which the end face of the resin layers 1-3 which are evacuated from the cutting area 9 is covered with the single resin layer 4 which will be cut.

FIG. 14A through FIG. 14D are diagrams for explaining the manufacturing method of the multilayer wiring board in the embodiment of FIG. 4A.

Figure 14A:
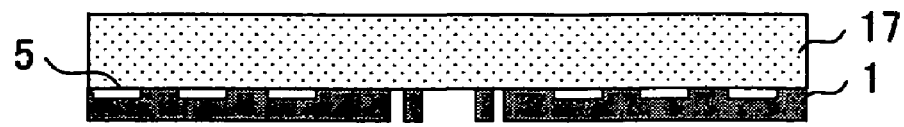
FIG. 14A, FIG. 14B, FIG. 14C and FIG. 14D are diagrams for explaining the manufacturing method of the multilayer wiring board concerning the embodiment of FIG. 4A.

In this embodiment, as shown in FIG. 14A, the first resin layer 1 is formed on the supporting board 17, so that it is evacuated from the cutting area 9A which will be cut at a next process. And the two isolated areas 1A are formed so that they are separately arranged in the cutting area 9A.

Figure 14B:
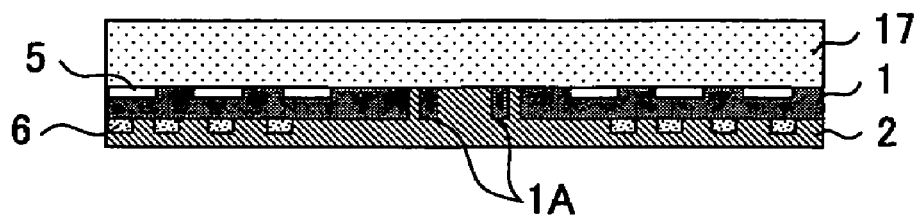

Then, as shown in FIG. 14B, the second wiring layer 6 is formed on the first resin layer 1 so that it is connected with the first wiring layer 5.

After the second wiring layer 6 is formed, the second resin layer 2 is formed. The second resin layer 2 is formed so that all the cutting area 9 (which will be cut at a next process), the first resin layer 1 and the second wiring layer 6 are covered with the second resin layer 2. Namely, only the second resin layer 2 is made continuous between the right and left wiring boards which are produced by cutting the multilayer wiring board.

Figure 14C:
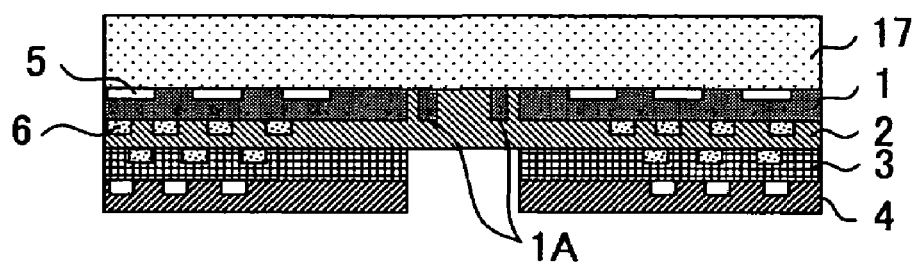

Then, as shown in FIG. 14C, the third and fourth wiring layers 7 and 8 and the third and fourth resin layers 3 and 4 are formed, respectively.

Figure 14D:
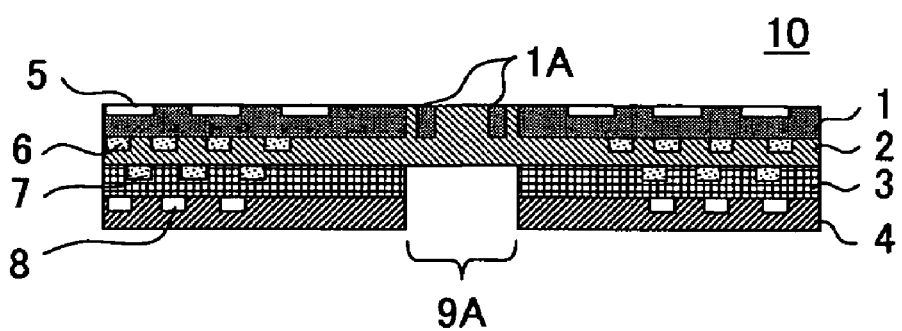

Finally, as shown in FIG. 14D, the supporting board 17 is removed. The third and fourth resin layers 3 and 4 are formed so that they are evacuated from the cutting area 9A which will be cut at a next process.

The detailed composition of this embodiment is essentially the same as that of the above-described embodiment of FIG. 11E. By using this manufacturing method, it is possible to form the isolated area 1A simultaneously at the time of formation of the first resin layer 1, and it is possible to form easily the multilayer wiring board 10 in which the crumple zone 9A is provided.

FIG. 15A through FIG. 15D are diagrams for explaining the manufacturing method of the multilayer wiring board in the embodiment of FIG. 5A.

Figure 15A:
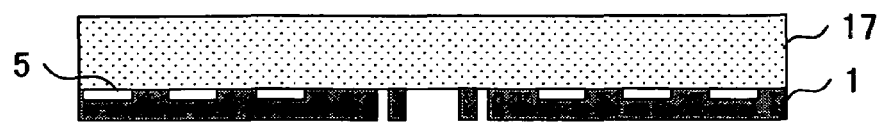
FIG. 15A, FIG. 15B, FIG. 15C and FIG. 15D are diagrams for explaining the manufacturing method of the multilayer wiring board concerning the embodiment of FIG. 5A.

In this embodiment, as shown in FIG. 15A, the first resin layer 1 is formed on the supporting board 17, so that it is evacuated from the cutting area 9A which will be cut at a next process. And the two isolated areas 1A are formed so that they are separately arranged in the cutting area 9A.

Figure 15B:
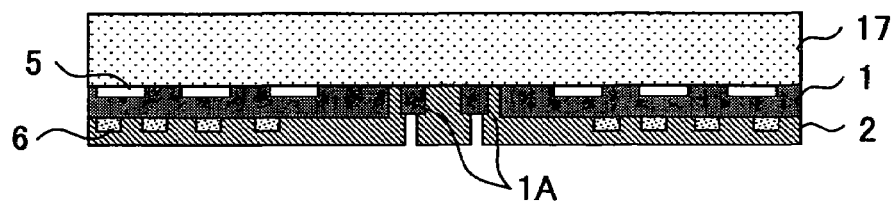

Then, as shown in FIG. 15B, the second wiring layer 6 is formed on the first resin layer 1 so that it is connected with the first wiring layer 5. After the second wiring layer 6 is formed, the second resin layer 2 is formed. The second resin layer 2 is formed and separately arranged on the isolated area 1A which is arranged at the time of formation of the first resin layer 1 and the area thereof is made small.

Figure 15C:
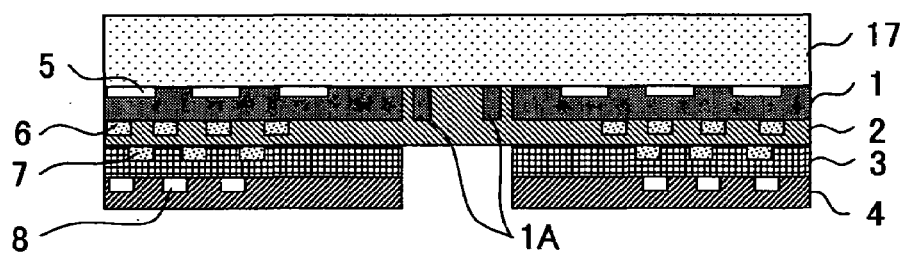

Then, as shown in FIG. 15C, the third and fourth wiring layers 7 and 8 and the third and fourth resin layers 3 and 4 are formed, respectively.

Figure 15D:
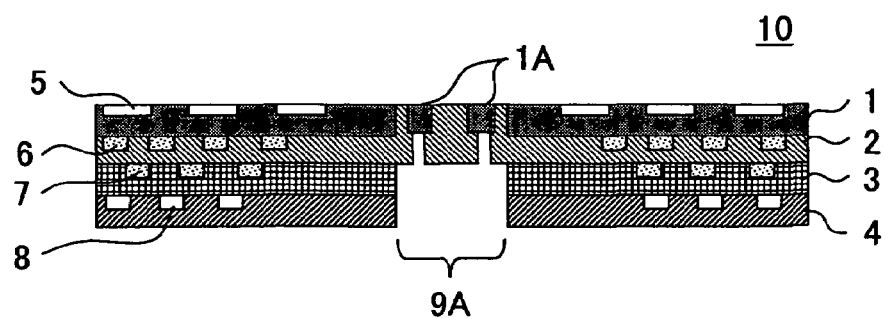

Finally, as shown in FIG. 15D, the supporting board 17 is removed. The third and fourth resin layers 3 and 4 are formed so that they are evacuated from the cutting area 9A which will be cut at a next process.

Similar to the above-mentioned embodiment of FIG. 14D, it is possible to form easily the multilayer wiring board 10 in which the more effective crumple zone 9A is arranged, by performing the manufacturing method of FIG. 15A to FIG. 15D.

FIG. 16A through FIG. 16D are diagrams for explaining the manufacturing method of the multilayer wiring board in the embodiment of FIG. 6A.

Figure 16A:
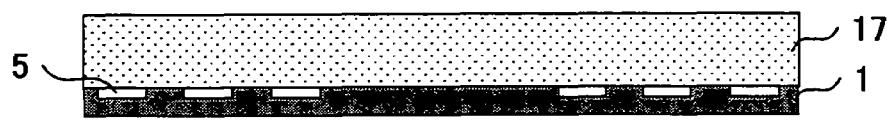
FIG. 16A, FIG. 16B, FIG. 16C and FIG. 16D are diagrams for explaining the manufacturing method of the multilayer wiring board concerning the embodiment of FIG. 6A.

In this embodiment, as shown in FIG. 16A, the first wiring layer 5 and the first resin layer 1 are formed on the supporting board 17.

Figure 16B:
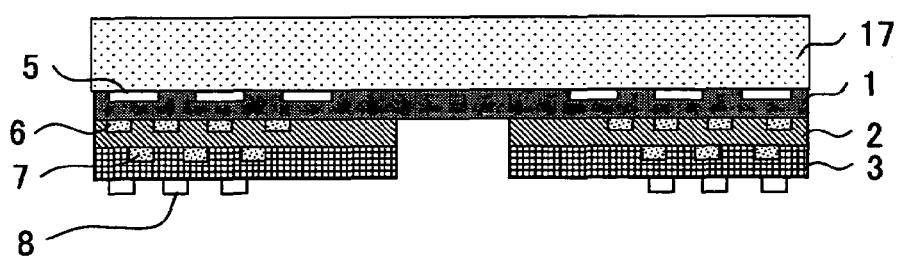

As shown in FIG. 16B, after the second wiring layer 6 is formed on the first resin layer 1, the second resin layer 2 is formed so that it is evacuated from the isolated area 9 which will be divided at a next process.

Figure 16C:
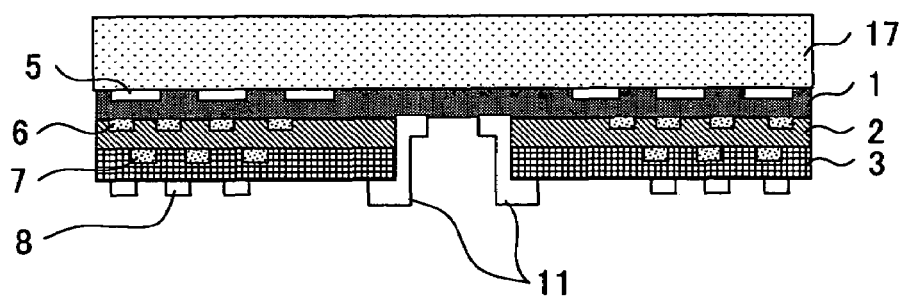

The third wiring layer 7 and the third resin layer 3 are formed similarly. After the third resin layer 3 is formed, the fourth wiring layer 8 is formed. At this time, as shown in FIG. 16C, the metal film 11 is simultaneously formed so that the end face of the second and third resin layers 2 and 3 is covered with the metal film 11.

Figure 16D:
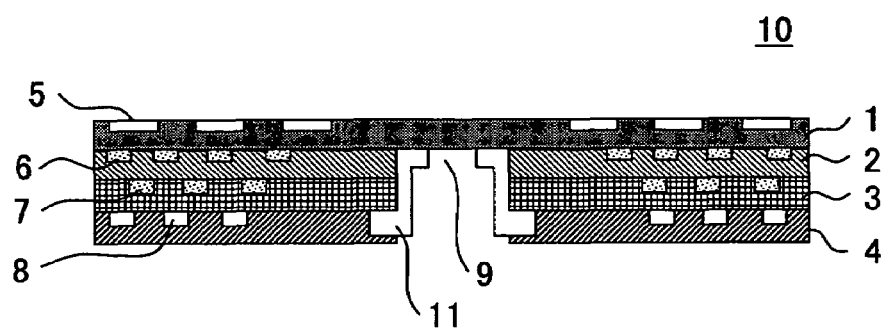

Then, as shown in FIG. 16D, the fourth resin layer 4 is formed, and the supporting board 17 is removed. In the present embodiment, the material and thickness of each wiring layer is as follows. The first wiring layer 5 is: Ni/Au/Ni=0.1 micrometers/0.5 micrometers/3.5 micrometers. The second and third wiring layers 6 and 7 are: Cu=3 micrometers. The fourth wiring layer 8 is: Cu/Ni/Au=3 micrometers/3.5 micrometers/0.2 micrometers.

The detailed composition of this embodiment is essentially the same as that of the above-mentioned embodiment of FIG. 11E. In this embodiment, the metal film 11 covering the end face of the second and third resin layers 2 and 3 is formed simultaneously with formation of the fourth wiring layer 8, and it is possible to form easily the multilayer wiring board 10 in which the metal film 11 is formed, without increasing an additional process.

FIG. 17A through FIG. 17D are diagrams for explaining the manufacturing method of the multilayer wiring board in the embodiment of FIG. 7A.

Figure 17A:
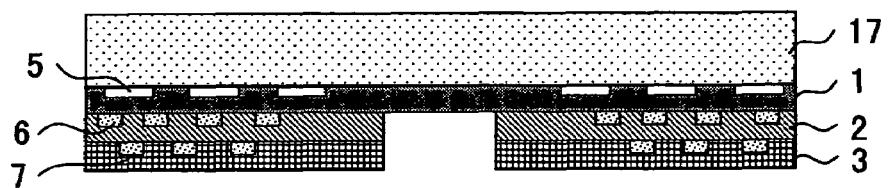
FIG. 17A, FIG. 17B, FIG. 17C and FIG. 17D are diagrams for explaining the manufacturing method of the multilayer wiring board concerning the embodiment of FIG. 7A.

In this embodiment, as shown in FIG. 17A, the first wiring layer 5 and the first resin layer 1 are formed on the supporting board 17.

After the second wiring layer 6 is formed, the second resin layer 2 is formed so that it is evacuated from the isolated area 9 which will be cut at a next process. The third wiring layer 7 and the third resin layer 3 are also formed similarly.

Figure 17B:
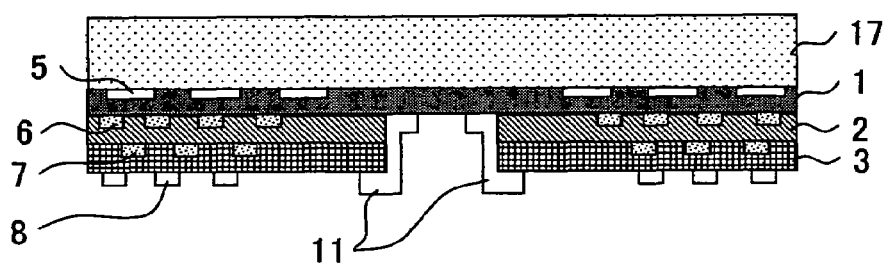

As shown in FIG. 17B, after the third resin layer 3 is formed, the fourth wiring layer 8 is formed. At this time, as shown in FIG. 17B, the metal film 11 is formed so that the end face of the second and third resin layers 2 and 3 is covered with the metal film 11.

Figure 17C:
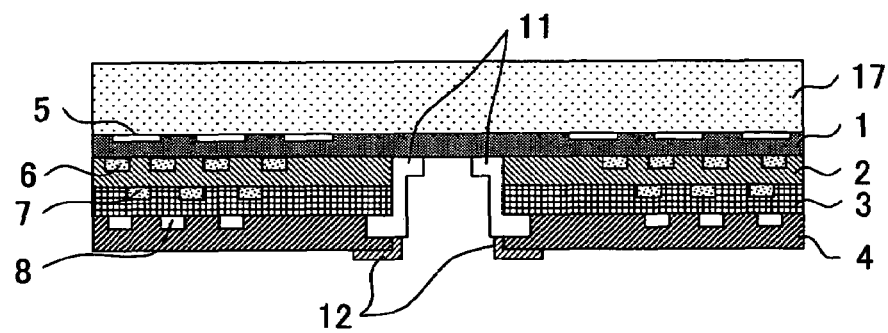

Then, as shown in FIG. 17C, the fourth resin layer 4 is formed. After the fourth resin layer 4 is formed, the second metal film 12 is formed so that it covers the end face of the fourth resin layer 4 and is connected to the metal film 11 which covers the end face of the second and third resin layers 2 and 3.

Figure 17D:
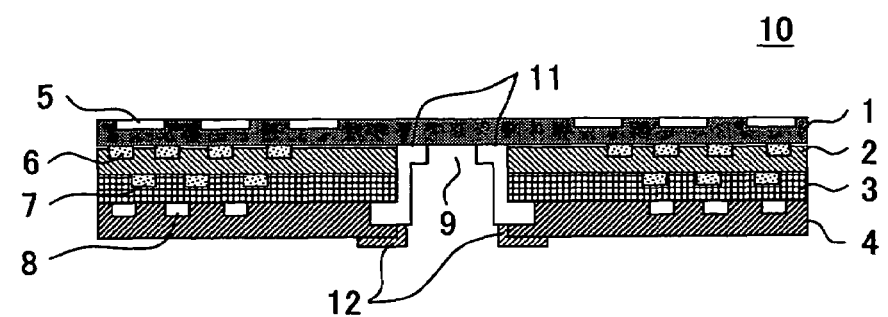

As shown in FIG. 17D, after the second metal film 12 is formed, the supporting board 17 is removed.

The detailed composition of this embodiment is essentially the same as that of the above-described embodiment of FIG. 11E. By using this manufacturing method, it is possible to form easily the multilayer wiring board 10 in which the metal films 11 and 12 are formed.

FIG. 18A through FIG. 18D are diagrams for explaining the manufacturing method of the multilayer wiring board in the embodiment of FIG. 8A.

Figure 18A:
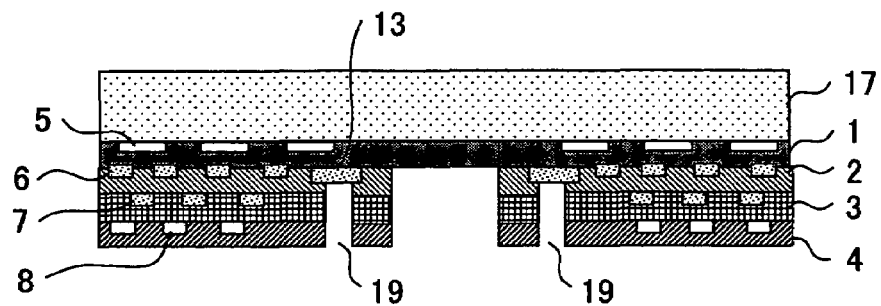
FIG. 18A, FIG. 18B, FIG. 18C and FIG. 18D are diagrams for explaining the manufacturing method of the multilayer wiring board concerning the embodiment of FIG. 8A.

In this embodiment, as shown in FIG. 18A, the first wiring layer 5 and the first resin layer 1 are formed on the supporting board 17. The second wiring layer 6 is formed on the first resin layer 1. The second resin layer 2 is evacuates from the cutting area 9 which will be cut at a next process.

The third wiring layer 7 is formed and the third resin layer 3 is formed like the second resin layer 2.

The via 19 which is connected to the first wiring layer 5 is formed in the second and third resin layers 2 and 3. The fourth wiring layer 8 is formed and the fourth resin layer 4 is formed.

Figure 18B:
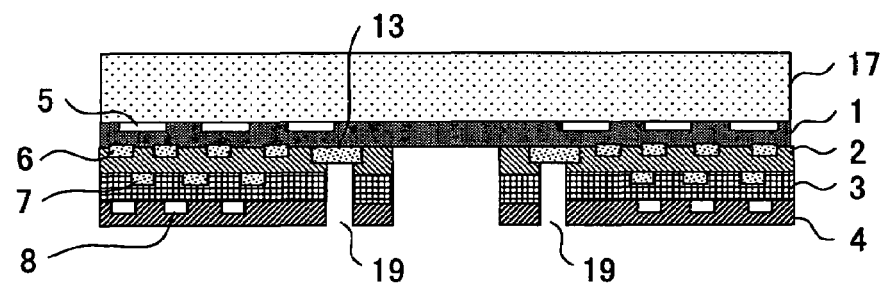

As shown in FIG. 18B, the via 19, which is connected to the first wiring layer 5 and penetrates the second through fourth resin layers 2-4, is formed also in the fourth resin layer 4.

Figure 18C:
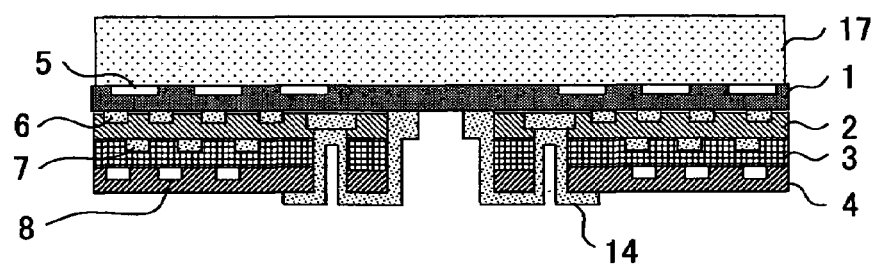
Figure 18D:
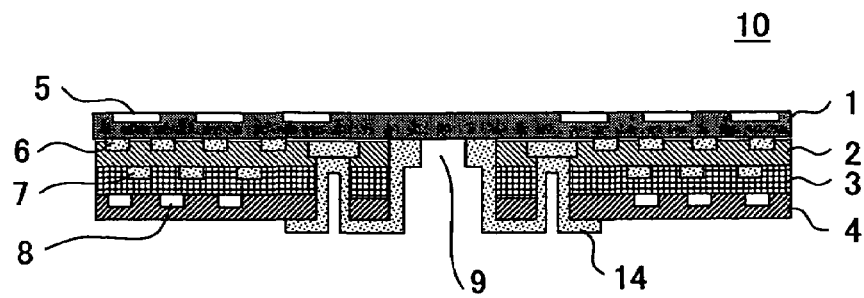

After the fourth resin layer 4 is formed, as shown in FIG. 18C, the metal film 14 is formed so that it is connected to the first wiring layer 5 through the via 19, and that the end face of the second through fourth resin layers 2-4 is covered with the metal film 14. Then, as shown in FIG. 18D, the supporting board 17 is removed.

The detailed composition of this embodiment is essentially the same as that of the above-described embodiment of FIG. 11E. In the multilayer wiring board 10 of this embodiment, in order to connect the metal film 14 covering the end face of the second through fourth resin layers 2-4, and the first wiring layer 5, the via 19 is formed in the second through fourth resin layers 2-4.

By using the above-mentioned photosensitive polyimide resin, the via 19 can be formed easily. Thus, it is possible to form easily the multilayer wiring board 10 of this embodiment by using the manufacturing method of FIG. 18A through FIG. 18D.

FIG. 19A through FIG. 19D are diagrams for explaining the manufacturing method of the multilayer wiring board in the embodiment of FIG. 9A.

Figure 19A:
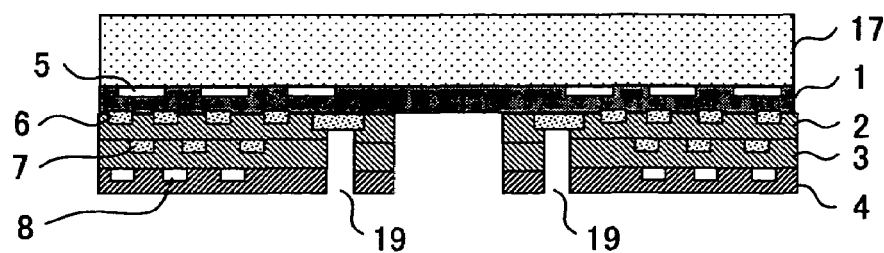
FIG. 19A, FIG. 19B, FIG. 19C and FIG. 19D are diagrams for explaining the manufacturing method of the multilayer wiring board concerning the embodiment of FIG. 9A.

In this embodiment, as shown in FIG. 19A, the first wiring layer 5 and the first resin layer 1 are formed on the supporting board 17.

The second wiring layer 6 is formed on the first resin layer 1. The second resin layer 2 is formed so that it is evacuates from the cutting area 9 which will be cut at a next process.

Moreover, the third wiring layer 7 is formed and the third resin layer 3 is formed like the second resin layer 2. The via 19 which is connected to the first wiring layer 5 is formed in the second and third resin layers 2 and 3. The fourth wiring layer 8 is formed and the fourth resin layer 4 is formed.

Figure 19B:
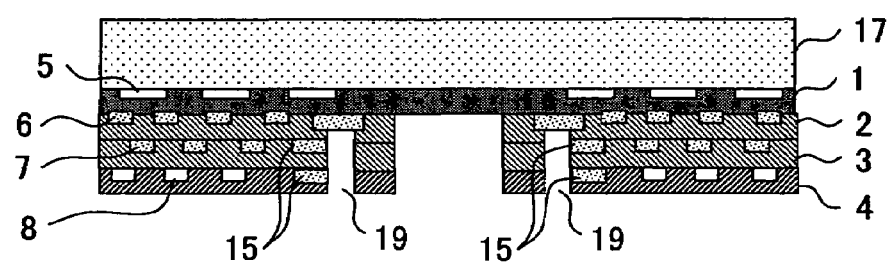

As shown in FIG. 19B, the via 19 which is connected to the first wiring layer 5 and penetrates the second through fourth resin layers 2-4 is formed also in the fourth resin layer 4.

The ground wiring 15 of the second and third wiring layers 6 and 7 is connected to the via 19 respectively, and this via 19 is formed so that it penetrates the second through fourth resin layers 2-4.

Figure 19C:
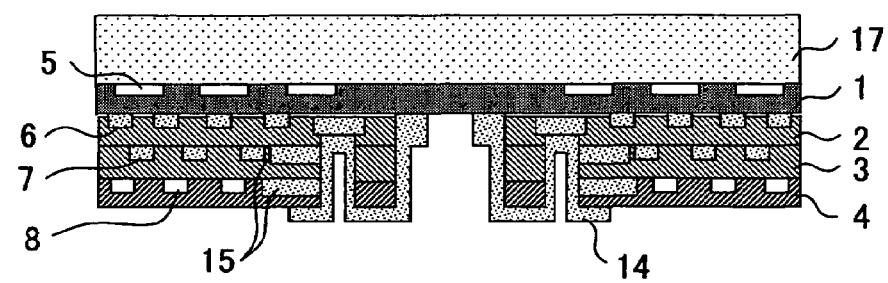
Figure 19D:
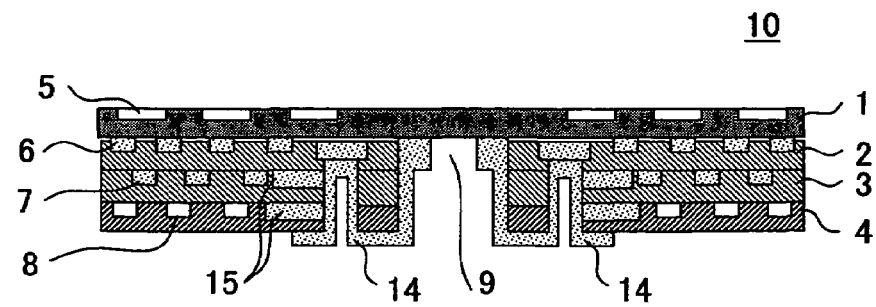

After the fourth resin layer is formed, as shown in FIG. 19C, the metal film 14 is formed so that it is connected to the first wiring layer 5 through the via 19 and connected to the ground wiring 15 of the second and third wiring layers 6 and 7, and the end face of the second through fourth resin layers 2-4 is covered with the metal film 14. Then, as shown in FIG. 19D, the supporting board 17 is removed.

The detailed composition of this embodiment is essentially the same as that of the above-described embodiment of FIG. 18D. The multilayer wiring board 10 of this embodiment is formed so that the ground wiring of each wiring layer is exposed to the via 19 formed in each resin layer, in order to connect the metal film 14 covering the end face of the second through fourth resin layers 2-4, and the ground wiring 15 of the first wiring layer 5.

The photo-lithography process can be performed for the formation of the metal film 14 simultaneously with the formation of each wiring layer and each resin layer, and it is possible for the manufacturing method of this embodiment to form easily the multilayer wiring board 10.

FIG. 20A through FIG. 20D are diagrams for explaining the manufacturing method of the multilayer wiring board in the embodiment of FIG. 10A.

Figure 20A:
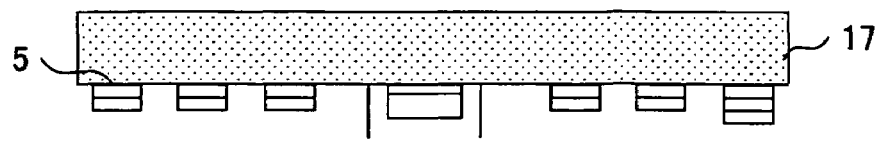
FIG. 20A, FIG. 20B, FIG. 20C and FIG. 20D are diagrams for explaining the manufacturing method of the multilayer wiring board concerning the embodiment of FIG. 10A.

In this embodiment, as shown in FIG. 20A, when forming the first wiring layer 5 on the supporting board 17, a metal film is simultaneously formed also in the cutting area 9 which will be cut at a next step.

Figure 20B:
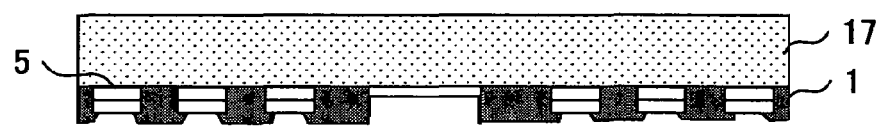
Figure 20C:
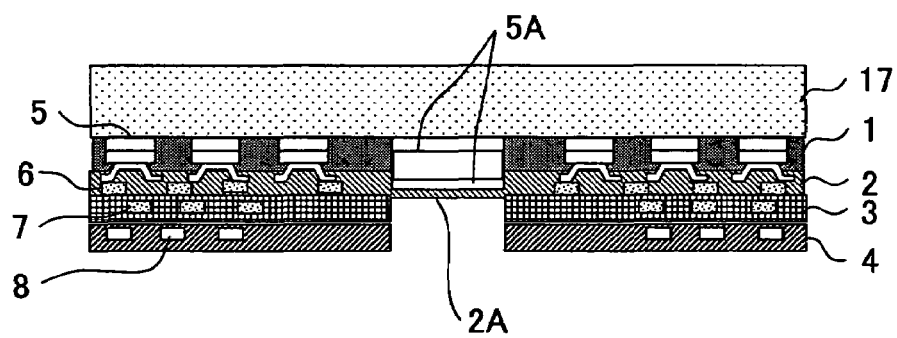

Then, as shown in FIG. 20B and FIG. 20C, the first resin layer 1 through the fourth wiring layer 8 are formed one by one by performing any of the above-mentioned methods.

Figure 20D:
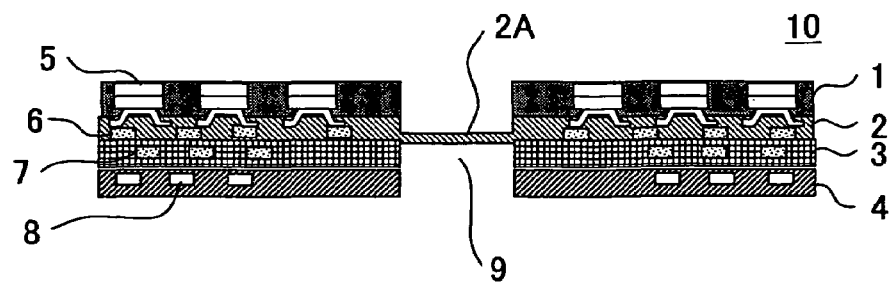

As shown in FIG. 20D, the metal film formed in the cutting area 9 is removed simultaneously in the process which is performed to remove the supporting board 17.

The detailed composition of this embodiment is essentially the same as that of the above-mentioned embodiment of FIG. 11E. The metal film formed in the cutting area 9 is formed simultaneously with the formation of the first wiring layer 5. In order to prevent the metal film from being removed the etching process performed at the time of removal of the supporting board 17, the metal material which forms the first wiring layer 5 and serves as a stopper metal is arranged so that it is sandwiched between the first resin layer 1 and the second resin layer 2.

At this time, the metal which serves as a stopper metal is formed by making the size of the via formed in the first resin layer 1 smaller than the size of the via formed in the second resin layer 2.

In the metal part 5A formed in the cutting area 9, the via of the first resin layer 1 and the via of the second resin layer 2 are formed in the same size. By forming in this way, at the time of the etching process to remove of the supporting board 17, the etchant is turned around the stopper metal, and it is possible to remove the metal film thoroughly. By using the manufacturing method of FIG. 20A through FIG. 20D, it is possible to easily form the multilayer wiring board 10 of this embodiment.

FIG. 21A, FIG. 21B, FIG. 21C and FIG. 21D show the composition of the interposer boards which are produced by cutting the multilayer wiring boards of FIG. 1A, FIG. 1B, FIG. 2A and FIG. 3, respectively.

In the embodiments of FIG. 21A to FIG. 21D, the cutting area 9 is formed only by a single resin layer, and almost no mechanical damage is found in the cutting plane of the multilayer wiring board 10 at the time of cutting the resin layer. It is possible to provide an interposer board with good reliability.

Figure 21A:
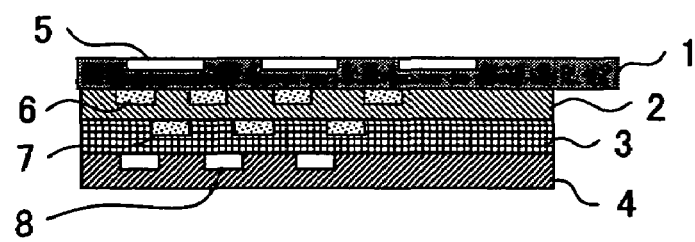
FIG. 21A, FIG. 21B, FIG. 21C and FIG. 21D are cross-sectional views showing the composition of the interposer boards which are produced by cutting the multilayer wiring boards of FIG. 1A, FIG. 1B, FIG. 2A and FIG. 3, respectively.
Figure 21B:
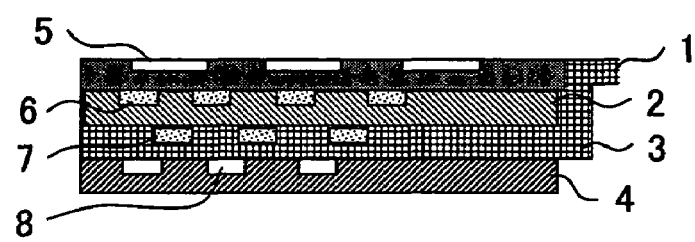
Figure 21C:
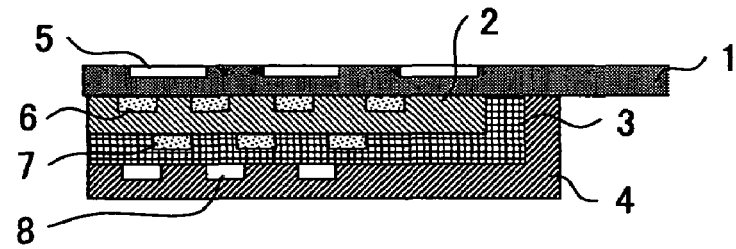
Figure 21D:
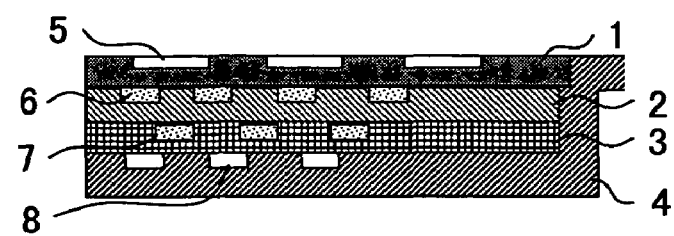
Figure 22A:
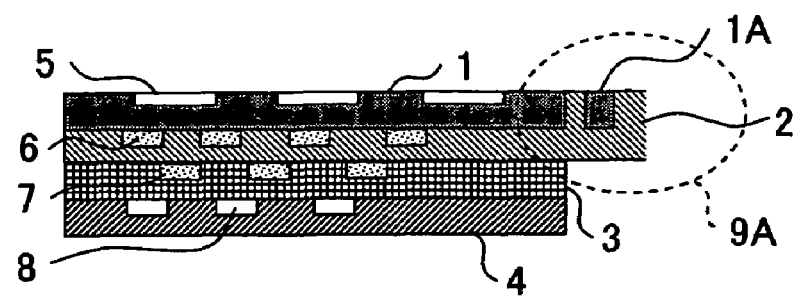
FIG. 22A, FIG. 22B, FIG. 22C, FIG. 22D and FIG. 22E are cross-sectional views showing the composition of the interposer boards which are produced by cutting the multilayer wiring boards of FIG. 4A, FIG. 5B, FIG. 5C, FIG. 5D and FIG. 5E, respectively.
Figure 22B:
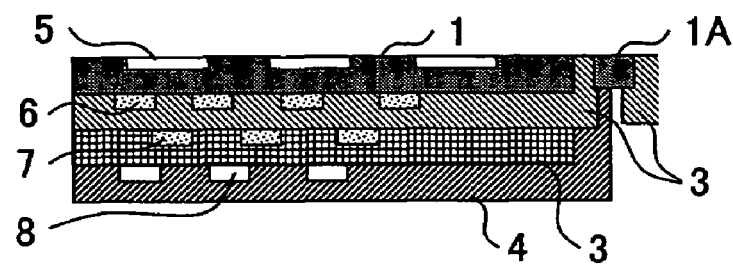
Figure 22C:
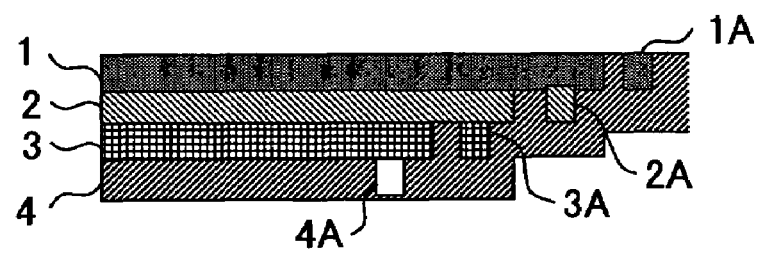
Figure 22D:
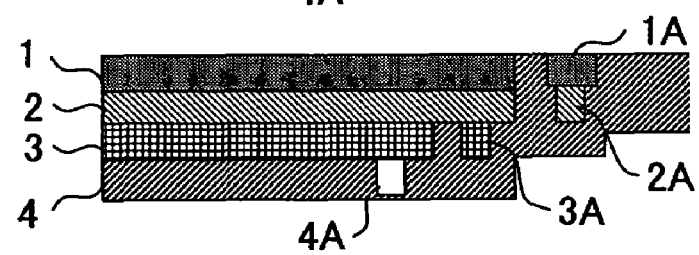
Figure 22E:
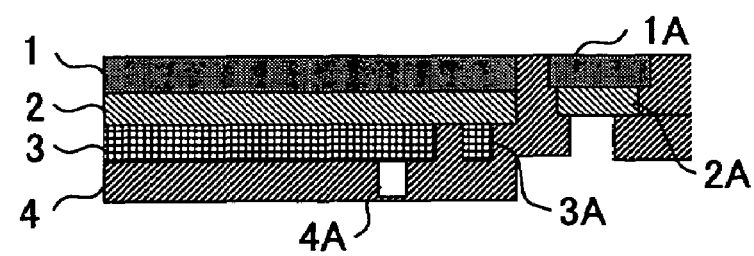

In the interposer boards shown in FIG. 21C and FIG. 21D, the cutting plane (end face) of the other resin layers is further covered with the resin layer, and the reliability can be raised.

The thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

FIG. 22A, FIG. 22B, FIG. 22C, FIG. 22D and FIG. 22E show the composition of the interposer boards which are produced by cutting the multilayer wiring boards of FIG. 4A, FIG. 5B, FIG. 5C, FIG. 5D and FIG. 5E, respectively.

In this embodiment, the interposer board is configured so that the crumple zone 9A is arranged in the peripheral part of the resin layer which is cut. It is possible to reduce the damage at the time of cutting the resin layer.

The thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 23A:
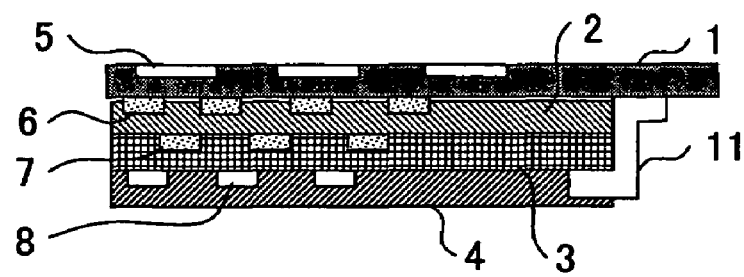
FIG. 23A and FIG. 23B are cross-sectional views showing the composition of the interposer boards which are produced by cutting the multilayer wiring boards of FIG. 6A and FIG. 6B, respectively.
Figure 23B:
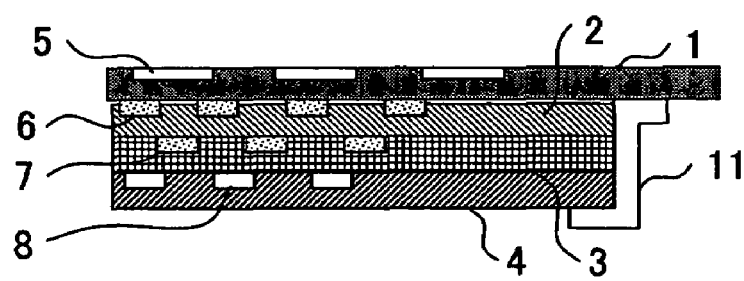

FIG. 23A and FIG. 23B show the composition of the interposer boards which are produced by cutting the multilayer wiring boards of FIG. 6A and FIG. 6B, respectively.

In this embodiment, the resin end face of the peripheral part in the thus produced interposer board is covered with the metal film 11. It is possible to provide a reliable interposer board by covering the end face of the plurality of resin layers 2-4 with the metal film 11.

The thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 24A:
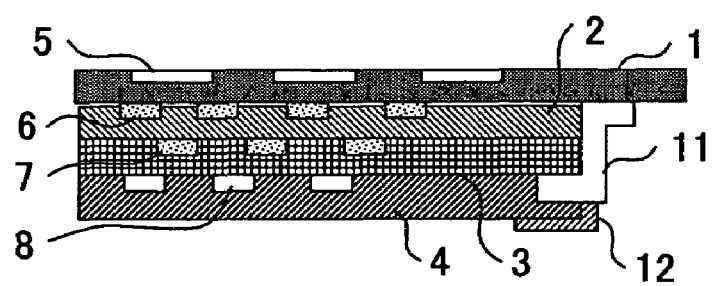
FIG. 24A and FIG. 24B are cross-sectional views showing the composition of the interposer boards which are produced by cutting the multilayer wiring boards of FIG. 7A and FIG. 7B, respectively.
Figure 24B:
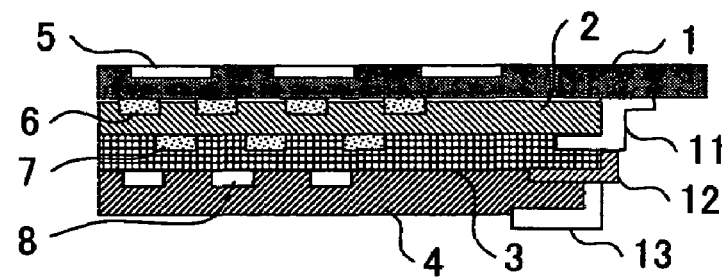

FIG. 24A and FIG. 24B show the composition of the interposer boards which are produced by cutting the multilayer wiring boards of FIG. 7A and FIG. 7B, respectively.

In this embodiment, the metal films 11-13 are formed for the resin layer 2-4 respectively, and the higher anchoring effect can be obtained and it is possible to provide an interposer board with higher reliability.

The thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, solely or in combination.

Figure 25A:
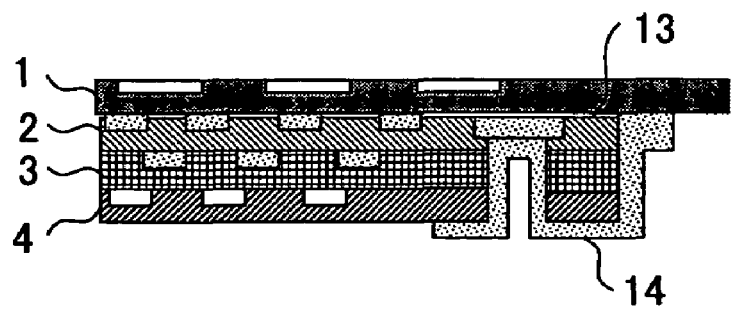
FIG. 25A, FIG. 25B and FIG. 25C are cross-sectional views showing the composition of the interposer board which is produced by cutting the multilayer wiring boards of FIG. 8A, FIG. 8B and FIG. 9, respectively.
Figure 25B:
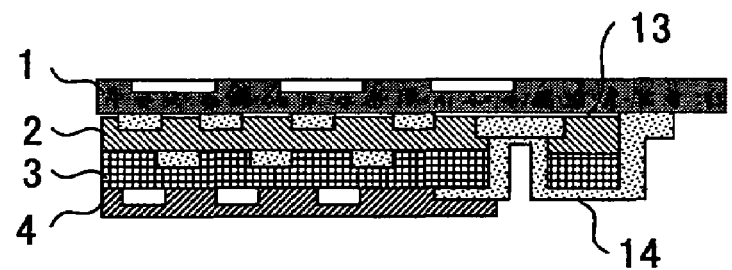
Figure 25C:
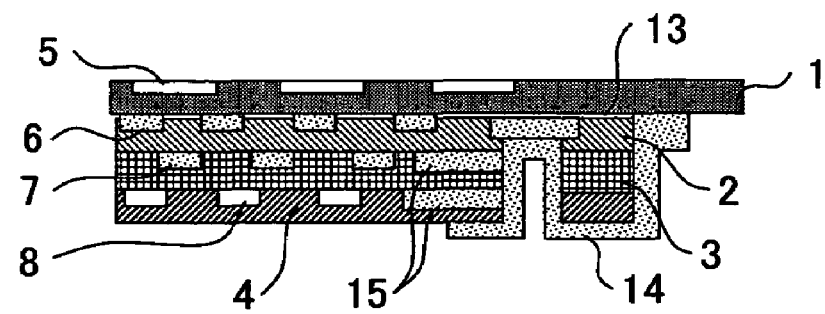

FIG. 25A, FIG. 25B and FIG. 25C show the composition of the interposer boards which are produced by cutting the multilayer wiring boards of FIG. 8A, FIG. 8B and FIG. 9, respectively.

In the embodiment of FIG. 25A and FIG. 25B, a more reliable interposer board can be provided by connecting the wiring layer 13 formed on the first resin layer 1 with the metal film 14 which protects the peripheral part of the end face of the second through fourth resin layers 2-4.

In the embodiment of FIG. 25C, an interposer board with increased electrical properties can be provided by connecting the metal film 14 in the circumferential part with the ground wiring 15 of each resin layer.

The thickness of each of the resin layers 1-4 is about 4-6 micrometers, and the thickness of each of the wiring layers 5-8 is about 3-8 micrometers. The resin layers 1-4 are made of any of a polyimide resin, a phenol resin, an epoxy resin, a silicon-based resin and BCB, and the wiring layers 5-8 are made of any of Cu, Ni and Au, or solely or in combination.

According to the composition of the interposer board of this embodiment, the advantageous features which are the same as those of the above-mentioned multilayer wiring boards of FIG. 8A, FIG. 8B and FIG. 9 can be acquired.

The present invention is not limited to the above-described embodiments, and variations and modifications may be made without departing from the scope of the present invention.

What is claimed is:

1. A multilayer wiring board, comprising:
   a plurality of wiring boards in which wiring layers and resin layers in each wiring board are alternately arranged in a laminated formation, wherein all the resin layers and the wiring layers, except a predetermined resin layer in the plurality of wiring boards, are separated in a cutting area and spaced between the plurality of wiring boards, wherein the predetermined resin layer is continuous in the cutting area, wherein said predetermined resin layer is a first outside resin layer which is arranged at outermost side among said resin layers, and wherein a second outside resin layer is arranged at opposite outermost side among said resin layers and has a raised portion in said cutting area between said plurality of wiring boards, and the raised portion covers an end face of at least one of other resin layers in the plurality of wiring boards.

* * * * *